US012359122B2

(12) United States Patent
Irwin et al.

(10) Patent No.: US 12,359,122 B2
(45) Date of Patent: Jul. 15, 2025

(54) IONIC LIQUID PEROVSKITE DEVICES

(71) Applicant: CubicPV Inc., Bedford, MA (US)

(72) Inventors: Michael D. Irwin, Heath, TX (US); Xiao-Xin Gao, Sion (CH); Zhaofu Fei, Kaiseraugst (CH); Paul J. Dyson, Lausanne (CH); Mohammad Khaja Nazeeruddin, Ecublens (CH)

(73) Assignee: CubicPV Inc., Bedford, MA (US)

( * ) Notice: Subject to any disclaimer, the term of this patent is extended or adjusted under 35 U.S.C. 154(b) by 10 days.

(21) Appl. No.: 18/313,207

(22) Filed: May 5, 2023

(65) Prior Publication Data

US 2023/0357632 A1 Nov. 9, 2023

Related U.S. Application Data

(60) Provisional application No. 63/339,837, filed on May 9, 2022, provisional application No. 63/339,337, filed on May 6, 2022.

(51) Int. Cl.
B05D 1/00 (2006.01)
C09K 11/02 (2006.01)
C09K 11/66 (2006.01)

(52) U.S. Cl.
CPC ............ C09K 11/664 (2013.01); B05D 1/005 (2013.01); C09K 11/025 (2013.01); C09K 2211/10 (2013.01)

(58) Field of Classification Search
CPC ....................................................... B05D 1/00
See application file for complete search history.

(56) References Cited

U.S. PATENT DOCUMENTS

2020/0161127 A1* 5/2020 Irwin .................. H10K 10/478

FOREIGN PATENT DOCUMENTS

KR          2080729 B1      2/2020
WO   WO2021209120 A1 *   10/2021

OTHER PUBLICATIONS

Notification concerning transmittal of international preliminary report on patentability, International application No. PCT/US2023/021255, mailed Nov. 21, 2024, 6 pages.
Zhu, X. et al., Chemical engineering journal, 2022(E-pub: Jan. 19, 2022), vol. 434, Article No. 134759 (internal pp. 1-7).
Wang, K. et al., Journal of materials science & technology, 2022(E-pub: Jan. 10, 2022), vol. 114, pp. 165-171.
Zhang, S. et al., Inorganic chemistry, 2022(E-pub: Mar. 15, 2022), vol. 61, No. 12, pp. 5010-5016.
Notification of transmittal of the international search report and the written opinion of the international searching authority, or the declaration, International application No. PCT/US2023/021255, mailed Sep. 5, 2023, 10 pages.

* cited by examiner

Primary Examiner — Kelly M Gambetta
Assistant Examiner — Mohammad Mayy
(74) Attorney, Agent, or Firm — Baker Botts L.L.P.

(57) ABSTRACT

A method including forming a lead halide precursor ink comprising a group 1 metal halide, a lead halide, an ionic liquid, and a solvent; depositing the lead halide precursor ink onto a substrate; drying the lead halide precursor ink to form a lead halide film; and annealing the lead halide film.

19 Claims, 14 Drawing Sheets

IONIC LIQUID PEROVSKITE DEVICES

CROSS-REFERENCE TO RELATED APPLICATIONS

This application claims priority to U.S. Provisional Patent Application No. 63/339,837, filed May 9, 2022, and entitled "IONIC LIQUID PEROVSKITE DEVICES", and U.S. Provisional Patent Application No. 63/339,337, filed May 6, 2022, and entitled "IONIC LIQUID PEROVSKITE DEVICES," the contents of which are incorporated by reference herein in its entirety.

BACKGROUND

Use of photovoltaics (PVs) to generate electrical power from solar energy or radiation may provide many benefits, including, for example, a power source, low or zero emissions, power production independent of the power grid, durable physical structures (no moving parts), stable and reliable systems, modular construction, relatively quick installation, safe manufacture and use, and good public opinion and acceptance of use.

SUMMARY

According to certain embodiments, a method includes: forming a lead halide precursor ink comprising a group 1 metal halide, a lead halide, an ionic liquid, and a solvent; depositing the lead halide precursor ink onto a substrate; drying the lead halide precursor ink to form a lead halide film; and annealing the lead halide film.

DETAILED DESCRIPTION OF PREFERRED EMBODIMENTS

The features and advantages of the present disclosure will be readily apparent to those skilled in the art. While numerous changes may be made by those skilled in the art, such changes are within the spirit of the invention.

Improvements in various aspects of PV technologies compatible with organic, non-organic, and/or hybrid PVs promise to further lower the cost of both organic PVs and other PVs. For example, some solar cells, such as perovskite PV solar cells, may take advantage of novel cost-effective and high-stability alternative components, such as nickel oxide interfacial layers. In addition, various kinds of solar cells may advantageously include chemical additives and other materials that may, among other advantages, be more cost-effective and durable than conventional options currently in existence.

The present disclosure relates generally to compositions of matter, apparatus and methods of use of materials in photovoltaic cells in creating electrical energy from solar radiation. More specifically, this disclosure relates to photoactive and other compositions of matter, as well as apparatus, methods of use, and formation of such compositions of matter.

Some or all of materials in accordance with some embodiments of the present disclosure may also advantageously be used in any organic or other electronic device, with some examples including, but not limited to: batteries, field-effect transistors (FETs), light-emitting diodes (LEDs), non-linear optical devices, transistors, ionizing radiation detectors, memristors, capacitors, rectifiers, and/or rectifying antennas.

In some embodiments, the present disclosure may provide PV and other similar devices (e.g., batteries, hybrid PV batteries, multi-junction PVs, FETs, LEDs, x-ray detectors, gamma ray detectors, photodiodes, CCDs, etc.). Such devices may in some embodiments include improved active material, interfacial layers (IFLs), and/or one or more perovskite materials. A perovskite material may be incorporated into various of one or more aspects of a PV or other device. A perovskite material according to some embodiments may be of the general formula $CMX_3$, where: C comprises one or more cations (e.g., an amine, ammonium, phosphonium, a Group 1 metal, a Group 2 metal, and/or other cations or cation-like compounds); M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X comprises one or more anions. Perovskite materials according to various embodiments are discussed in greater detail below.

Photovoltaic Cells and Other Electronic Devices

Figure 1:
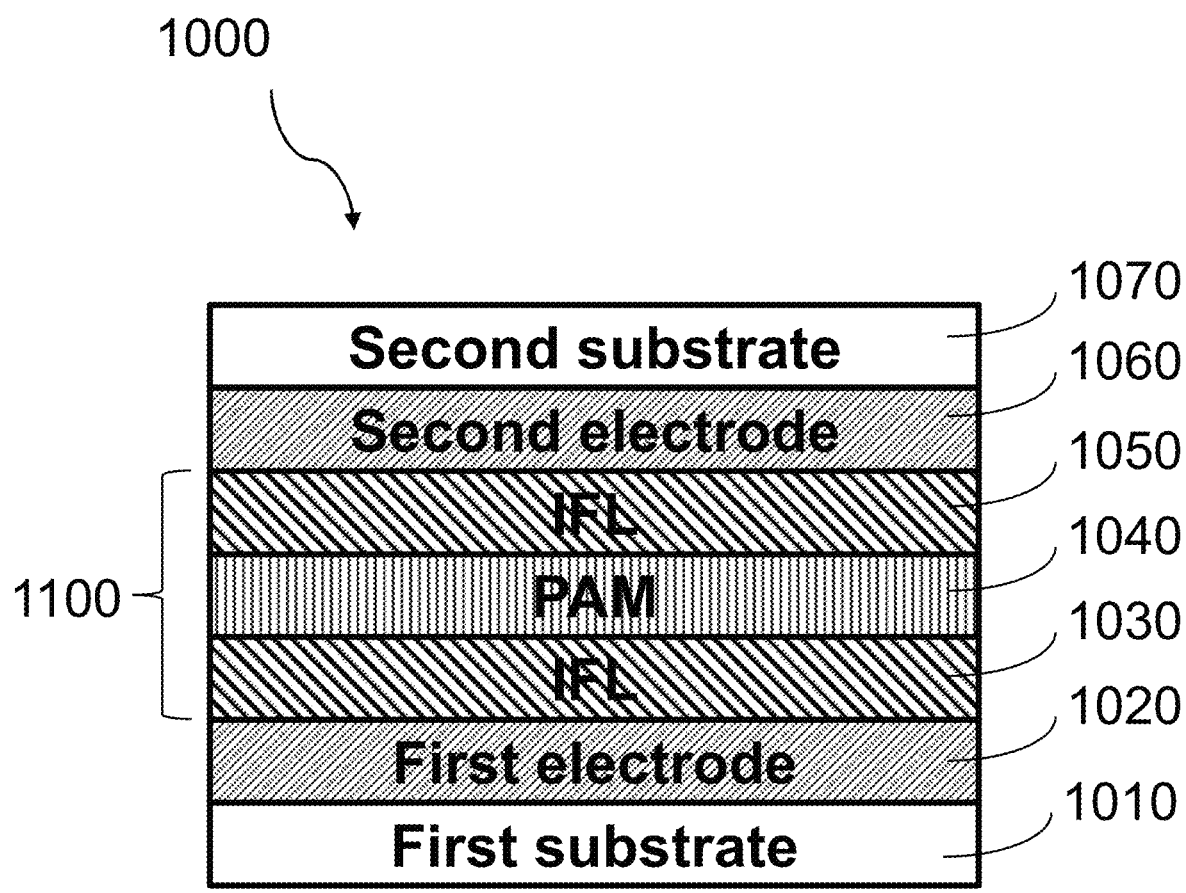
FIG. 1 is a schematic diagram illustrating components of a photovoltaic device according to some embodiments of the present disclosure.
Figure 3:
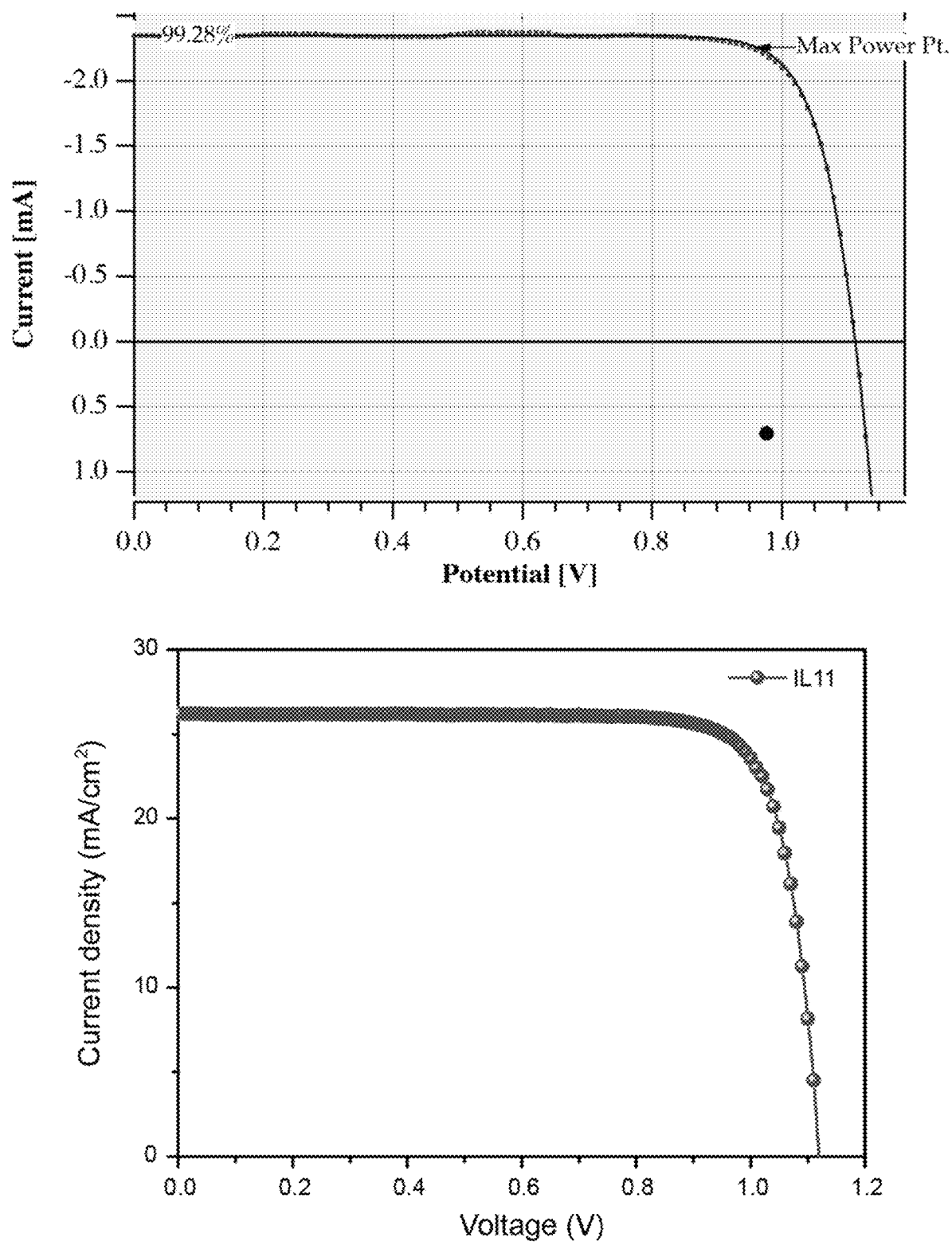
FIG. 3 illustrates current-voltage (I-V) and current density-voltage (J-V) scans of a perovskite material photovoltaic device according to some embodiments of the present disclosure.
Figure 4:
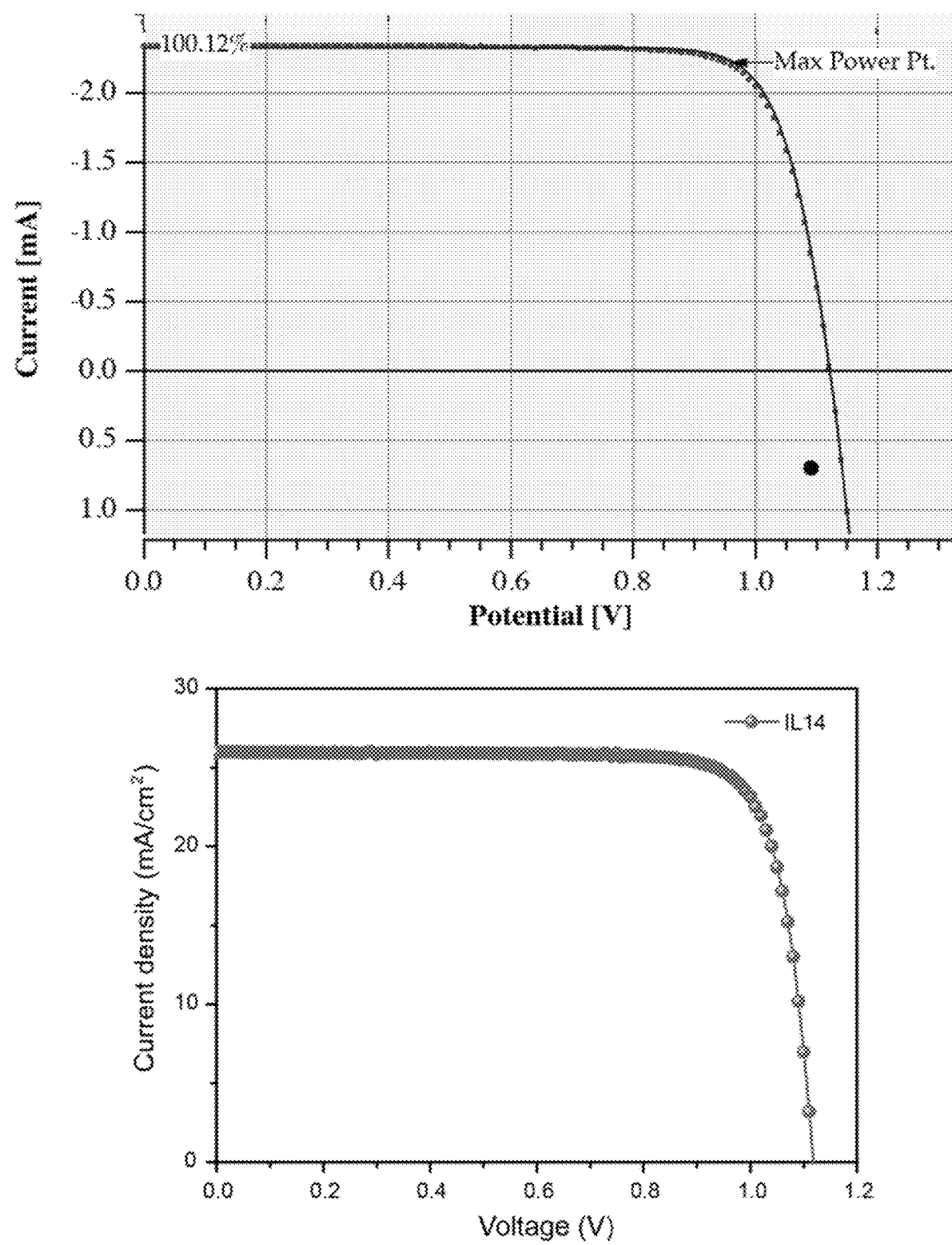
FIG. 4 illustrates current-voltage (I-V) and current density-voltage (J-V) scans of a perovskite material photovoltaic device according to some embodiments of the present disclosure.

Some PV embodiments may be described by reference to the illustrative depictions of a perovskite material device as shown in FIG. 1. An example PV architecture according to some embodiments may be substantially of the form substrate-anode-IFL-active layer-IFL-cathode. The active layer of some embodiments may be photoactive, and/or it may include photoactive material. Other layers and materials may be utilized in the cell as is known in the art. Furthermore, it should be noted that the use of the term "active layer" is in no way meant to restrict or otherwise define, explicitly or implicitly, the properties of any other layer—for instance, in some embodiments, either or both IFLs may also be active insofar as they may be semiconducting. In particular, referring to FIG. 1, a stylized generic PV cell 1000 is depicted, illustrating the highly interfacial nature of some layers within the PV. The PV 1000 represents a generic architecture applicable to several PV devices, such as perovskite material PV embodiments. The PV cell 1000 includes a transparent substrate layer 1010, which may be glass (or a material similarly transparent to solar radiation) which allows solar radiation to transmit through the layer. The transparent layer of some embodiments may also be referred to as a superstrate or substrate, and it may comprise any one or more of a variety of rigid or flexible materials such as: glass, polyethylene, polypropylene, polycarbonate, polyimide, PMMA, PET, PEN, Kapton, or quartz. In general, the term substrate is used to refer to material upon which the device is deposited during manufacturing. The photoactive (PAM) layer 1040 may be composed of electron donor or p-type material, and/or an electron acceptor or n-type material, and/or an ambipolar semiconductor, which exhibits both p- and n-type material characteristics, and/or an intrinsic semiconductor which exhibits neither n-type or p-type characteristics. Photoactive layer 1040 may be a perovskite material as described herein, in some embodiments. The active layer or, as depicted in FIG. 1, the photoactive layer 1040, is sandwiched between two electrically conductive electrode layers 1020 and 1060. In FIG. 1, the electrode layer 1020 may be a transparent conductor such as a tin-doped indium oxide (ITO material) or other material as described herein. In other embodiments second substrate 1070 and second electrode 1060 may be transparent. As previously noted, an active layer of some embodiments need not necessarily be photoactive, although in the device shown in FIG. 1, it is. The electrode layer 1060 may be an aluminum material or other metal, or other conductive materials such as carbon. Other materials may be used as is known in the art. The cell 1100 also includes an IFL 1030, shown in the example of FIG. 1. The IFL may assist in charge separation. In other embodiments, the IFL 1030 may comprise a multi-layer IFL. For example, a perovskite material device may contain zero, one, two, three, four, five, or more interfacial layers (such as the example devices of FIGS. 2 to 4 of U.S. Pat. No. 11,171,290, which is incorporated by reference herein in its entirety). There also may be an IFL 1050 adjacent to electrode 1060. In some embodiments, the IFL 1050 adjacent to electrode 1060 may also or instead comprise a multi-layer IFL. In some embodiments, the IFL on the cathode side of the device (e.g., IFL 1050 as shown in FIG. 1) may be p-type, and the IFL on the anode side of the device (e.g., IFL 1030 as shown in FIG. 1) may be n-type. In other embodiments, however, the cathode-side IFL may be n-type and the anode-side IFL may be p-type.

The cell 1100 may be attached to electrical leads by electrodes 1060 and 1020 and a discharge unit, such as a battery, motor, capacitor, electric grid, or any other electrical load. Additional embodiments of devices that may be used in accordance with the present disclosure can be found in U.S. Pat. Nos. 9,425,396 and 11,186,495, and US Patent Publication No. 2018/0301288, the disclosures of which are incorporated by reference herein in its entirety.

Various embodiments of the present disclosure provide improved materials and/or designs in various aspects of solar cell and other devices, including among other things, active materials (including hole-transport and/or electron-transport layers), interfacial layers, and overall device design.

Perovskite Material

A perovskite material may be incorporated into one or more aspects of a PV or other device. A perovskite material according to some embodiments may be of the general formula $C_wM_yX_z$, where: C comprises one or more cations (e.g., an amine, ammonium, phosphonium a Group 1 metal, a Group 2 metal, and/or other cations or cation-like compounds); M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); X comprises one or more anions; and w, y, and z represent real numbers between 1 and 20. In some embodiments, C may include one or more organic cations. In some embodiments, each organic cation C may be larger than each metal M, and each anion X may be capable of bonding with both a cation C and a metal M.

In certain embodiments, C may include an ammonium, an organic cation of the general formula $[NR_4]+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., pyridine, pyrrole, pyrrolidine, piperidine, tetrahydroquinoline, 2-hexahydropyrimidin-2-ylidenehexahydropyrimidine, octahydropyrazino[2,3-b]pyrazine, pyrazino[2,3-b]pyrazine, quinoxalino[2,3-b]quinoxaline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof, any amino acid (e.g., glycine, cysteine, proline, glutamic acid, arginine, serine, histidine, 5-ammoniumvaleric acid) including alpha, beta, gamma, and greater derivatives; any silicon containing group (e.g., siloxane); and any alkoxy or group, —OCxHy, where x=0-20, y=1-42.

In certain embodiments, C may include a formamidinium, an organic cation of the general formula $[R_2NCRNR_2]^+$ where the R groups may be the same or different groups. Suitable R groups include, but are not limited to—any of the R groups listed in the preceding paragraph.

Formula 1

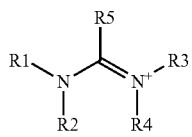

Formula 1 illustrates the structure of a formamidinium cation having the general formula of $[R_2NCRNR_2]^+$ as described above. Formula 2 illustrates examples structures of several formamidinium cations that may serve as a cation "C" in a perovskite material.

Formula 2

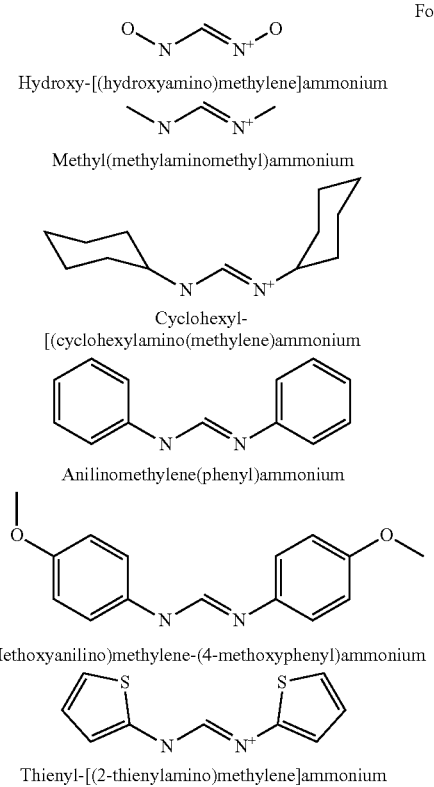

Hydroxy-[(hydroxyamino)methylene]ammonium

Methyl(methylaminomethyl)ammonium

Cyclohexyl-[(cyclohexylamino(methylene)ammonium

Anilinomethylene(phenyl)ammonium (Methoxyanilino)methylene-(4-methoxyphenyl)ammonium Thienyl-[(2-thienylamino)methylene]ammonium In certain embodiments, C may include a guanidinium, an organic cation of the general formula $[(R_2N)_2C=NR_2]^+$ where the R groups may be the same or different groups. Suitable R groups include, but are not limited to any of the R groups listed above in the preceding paragraphs.

Formula 3

Formula 3 illustrates the structure of a guanidinium cation having the general formula of $[(R_2N)_2C=NR_2]^+$ as described above. Formula 4 illustrates examples of structures of several guanidinium cations that may serve as a cation "C" in a perovskite material.

Formula 4

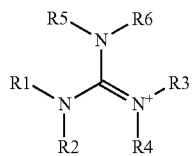

[Amino(methylamino)methylene]-methyl-ammonium

[Amino(trifluoromethylamino)methylene]-(trifluoromethyl)ammonium 2,3,5,6-Tetrahydro-1H-imidazol[1,2-a]imidazol-7-ium

[Amino-(cyclohexylamino)methylene]-cyclohexyl-ammonium

[Amino(2-thienylamino)methylene]-(2-thienyl)ammonium

[Amino(anilino)methylene]-phenyl-ammonium

[Amino-(4-methoxyanilino)methylene]-(4-methoxyphenyl)ammonium

In certain embodiments, C may include an ethene tetramine cation, an organic cation of the general formula $[(R_2N)_2C=C(NR_2)_2]^+$ where the R groups may be the same or different groups. Suitable R groups include, but are not limited to—any of the R groups listed above in the preceding paragraphs.

Formula 5

Formula 5 illustrates the structure of an ethene tetramine cation having the general formula of $[(R_2N)_2C=C(NR_2)_2]^+$ as described above. Formula 6 illustrates examples of structures of several ethene tetramine ions that may serve as a cation "C" in a perovskite material.

Formula 6

2-hexahydropyrimidin-2-ylidenehexahydropyrimidine pyrazino[2,3-b]pyrazine

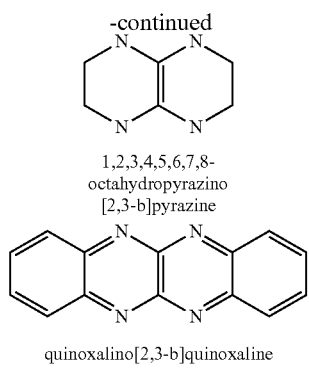

1,2,3,4,5,6,7,8-octahydropyrazino[2,3-b]pyrazine quinoxalino[2,3-b]quinoxaline

In certain embodiments, C may include an imidazolium cation, an aromatic, cyclic organic cation of the general formula [CRNRCRNRCR]$^+$ where the R groups may be the same or different groups. Suitable R groups may include, but are not limited to any of the R groups listed above in the preceding paragraphs.

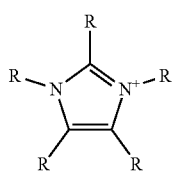

Formula 7

Formula 7 illustrates the structure of an imidazolium cation having the general formula of [CRNRCRNRCR]$^+$ as described above.

In some embodiments, X may include one or more halides. In certain embodiments, X may instead or in addition include a Group 16 anion. In certain embodiments, the Group 16 anion may be oxide, sulfide, selenide, or telluride. In certain embodiments, X may be F, Cl, Br, I, SCN, CN, or any other pseudohalide. Other acceptable non-halide anions may include, but are not limited to: nitrate, nitrite, carboxylate, acetate, acetonyl acetonate, formate, oxalate, sulfate, sulfite, thiosulfate, phosphate, tetrafluoroborate, hexafluorophosphate, tetra(perfluorophenyl) borate, hydride, oxide, peroxide, hydroxide, nitride, arsenate, arsenite, perchlorate, carbonate, bicarbonate, chromate, dichromate, iodate, bromate, chlorate, chlorite, hypochlorite, hypobromite, cyanide, cyanate, isocyanate, fulminate, thiocyanate, isothiocyanate, azide, tetracarbonylcobaltate, carbamoyldicyanomethanide, dicyanonitrosomethanide, dicyanamide, tricyanomethanide, amide, and permanganate.

By way of explanation, and without implying any limitations, exemplary embodiments of perovskite material having a formula $C_wM_yX_z$, are discussed below. In one embodiment, a perovskite material may comprise the empirical formula $CMX_3$ where: M comprises one of the aforementioned metals, C comprises one or more of the aforementioned cations, a Group 1 metal, a Group 2 metal, and/or other cations or cation-like compounds; and X comprises one or more of the aforementioned anions.

In another embodiment, a perovskite material may comprise the empirical formula $C'M_2X_6$ where: C' comprises a cation with a 2+ charge including one or more of the aforementioned cations, diammonium butane, a Group 1 metal, a Group 2 metal, and/or other cations or cation-like compounds.

In another embodiment, a perovskite material may comprise the empirical formula $C'MX_4$ where: C' comprises a cation with a 2+ charge including one or more of the aforementioned cations, diammonium butane, a Group 1 metal, a Group 2 metal, and/or other cations or cation-like compounds. In such an embodiment, the perovskite material may have a 2D structure.

In one embodiment, a perovskite material may comprise the empirical formula $C_3M_2X_9$, $CM_2X_7$, or $C_2MX_4$ where: C comprises one or more of the aforementioned cations, a Group 1 metal, a Group 2 metal, and/or other cations or cation-like compounds.

Perovskite materials may also comprise mixed ion formulations where C, M, or X comprise two or more species. In some embodiments, the perovskite material may comprise two or more anions or three or more anions. In some embodiments, the perovskite material may comprise two more cations or three or more cations. In certain embodiments, the perovskite material may comprise two or more metals or three or more metals.

In one example, a perovskite material in the active layer may have the formulation $CMX_{3-y}X'_y$, (0≥y≥3), where: C comprises one or more cations (e.g., an amine, ammonium, a Group 1 metal, a Group 2 metal, formamidinium, guanidinium, ethene tetramine, phosphonium, imidazolium, and/or other cations or cation-like compounds); M comprises one or more metals (e.g., Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X and X' comprise one or more anions. In one embodiment, the perovskite material may comprise $CPbI_{3-y}Cl_y$. In another example, a perovskite material in the active layer may have the formulation $C_{1-x}C'_xMX_3$ (0≥x≥1), where C and C' comprise one or more cations as discussed above. In another example, a perovskite material in the active layer may have the formulation $CM_{1-z}M'_zX_3$ (0≥z≥1), where M and M' comprise one or more metals as discussed above. In one example, a perovskite material in the active layer may have the formulation $C_{1-x}C'_xM_{1-z}M'_zX_{3-y}X'_y$ (0≥x≥1; 0≥y≥3; 0≥z≥1), where: C and C' comprise one or more cations as discussed above; M and M' comprise one or more metals as discussed above; and X and X' comprise one or more anions as discussed above.

By way of explanation, and without implying any limitations, exemplary embodiments of perovskite material may be for example, $Cs_{0.1}FA_{0.9}Pb(I_{0.9}Cl_{0.1})_3$; $Rb_{0.1}FA_{0.9}Pb(I_{0.9}Cl_{0.1})_3$ $Cs_{0.1}FA_{0.9}PbI_3$; $FAPb_{0.5}Sn_{0.5}I_3$; $FA_{0.83}Cs_{0.17}Pb(I_{0.6}Br_{0.4})_3$; $FA_{0.83}Cs_{0.12}Rb_{0.05}Pb(I_{0.6}Br_{0.4})_3$ and $FA_{0.85}MA_{0.15}Pb(I_{0.85}Br_{0.15})_3$.

Formation of the Perovskite Material Active Layer

In certain embodiments, the perovskite material may be deposited as an active layer in a PV device by, for example, blade coating, drop casting, spin casting, slot-die printing, screen printing, or ink-jet printing onto a substrate layer using the steps described below.

First, a lead halide precursor ink is formed. An amount of lead halide may be massed in a clean, dry vessel in a controlled atmosphere environment (e.g., a controlled atmosphere box with glove-containing portholes allows for materials manipulation in an air-free environment). Suitable lead halides include, but are not limited to, lead (II) iodide, lead (II) bromide, lead (II) chloride, and lead (II) fluoride. The lead halide may comprise a single species of lead halide or it may comprise a lead halide mixture in a precise ratio. In certain embodiments, the lead halide mixture may comprise any binary, ternary, or quaternary ratio of 0.001-100 mol % of iodide, bromide, chloride, or fluoride. In one embodiment, the lead halide mixture may comprise lead (II) chloride and lead (II) iodide in a ratio of about 10:90 mol:mol. In other embodiments, the lead halide mixture may comprise lead (II) chloride and lead (II) iodide in a ratio of about 5:95, about 7.5:92.5, or about 15:85 mol:mol.

Alternatively, other lead salt precursors may be used in conjunction with or in lieu of lead halide salts to form the precursor ink. Suitable precursor salts may comprise any combination of lead (II) or lead(IV) and the following anions: nitrate, nitrite, carboxylate, acetate, acetonyl acetonate, formate, oxalate, sulfate, sulfite, thiosulfate, phosphate, tetrafluoroborate, hexafluorophosphate, tetra(perfluorophenyl) borate, hydride, oxide, peroxide, hydroxide, nitride, arsenate, arsenite, perchlorate, carbonate, bicarbonate, chromate, dichromate, iodate, bromate, chlorate, chlorite, hypochlorite, hypobromite, cyanide, cyanate, isocyanate, fulminate, thiocyanate, isothiocyanate, azide, tetracarbonylcobaltate, carbamoyldicyanomethanide, dicyanonitrosomethanide, dicyanamide, tricyanomethanide, amide, and permanganate.

The precursor ink may further comprise a lead (II) or lead (IV) salt in mole ratios of 0 to 100% to the following metal ions Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr as a salt of the aforementioned anions.

A solvent may then be added to the vessel to dissolve the lead solids to form the lead halide precursor ink. Suitable solvents include, but are not limited to, dry N-cyclohexyl-2-pyrrolidone, alkyl-2-pyrrolidone, dimethylformamide, dialkylformamide, dimethylsulfoxide (DMSO), methanol, ethanol, propanol, butanol, tetrahydrofuran, formamide, tert-butylpyridine, pyridine, alkylpyridine, pyrrolidine, chlorobenzene, dichlorobenzene, dichloromethane, chloroform, alkylnitrile, arylnitrile, acetonitrile, alkoxylalcohols, alkoxyethanol, 2-methoxyethanol, glycols, propylene glycol, ethylene glycol, and combinations thereof. In one embodiment, the lead solids are dissolved in dry dimethylformamide (DMF). In some embodiments, the solvent may further comprise 2-methoxyethanol and acetonitrile. In some embodiments, 2-methoxyethanol and acetonitrile may be added in a volume ratio of from about 25:75 to about 75:25, or at least 25:75. In certain embodiments, the solvent may include a ratio of 2-methoxyethanol and acetonitrile to DMF of from about 1:100 to about 1:1, or from about 1:100 to about 1:5, on a volume basis. In certain embodiments, the solvent may include a ratio of 2-methoxyethanol and acetonitrile to DMF of at least about 1:100 on a volume basis.

In certain embodiments, the lead solids may be dissolved at a temperature between about 20° C. to about 150° C. In one embodiment, the lead halide solids are dissolved at about 85° C. The lead solids may be dissolved for as long as necessary to form a solution, which may take place over a time period up to about 72 hours. The resulting solution forms the base of the lead halide precursor ink. In some embodiments, the lead halide precursor ink may have a lead halide concentration between about 0.001M and about 10M, or about 1 M.

Optionally, certain additives may be added to the lead halide precursor ink to affect the final perovskite crystallinity and stability. In some embodiments, the lead halide precursor ink may further comprise an amino acid (e.g., 5-aminovaleric acid, histidine, glycine, lysine), an amino acid hydrohalide (e.g., 5-amino valeric acid hydrochloride), an IFL surface-modifying (SAM) agent (such as those discussed earlier in the specification), or a combination thereof. Amino acids suitable for lead halide precursor inks may include, but are not limited to α-amino acids, β-amino acids, γ-amino acids, δ-amino acids, and any combination thereof. In one embodiment, formamidinium chloride may be added to the lead halide precursor ink. In other embodiments, the halide of any cation discussed earlier in the specification may be used. In some embodiments, combinations of additives may be added to the lead halide precursor ink including, for example, the combination of formamidinium chloride and 5-amino valeric acid hydrochloride.

The additives, including, in some embodiments, formamidinium chloride and/or 5-amino valeric acid hydrochloride, may be added to the lead halide precursor ink at various concentrations depending on the desired characteristics of the resulting perovskite material. In one embodiment, the additives may be added in a concentration of about 1 nM to about 1 M, from about 1 µM to about 1 M, or from about 1 µM to about 1 mM.

Optionally, in certain embodiments, water may be added to the lead halide precursor ink. By way of explanation, and without limiting the disclosure to any particular theory or mechanism, the presence of water affects perovskite thin-film crystalline growth. Under normal circumstances, water may be absorbed as vapor from the air. However, it is possible to control the perovskite PV crystallinity through the direct addition of water to the lead halide precursor ink in specific concentrations. Suitable water includes distilled, deionized water, or any other source of water that is substantially free of contaminants (including minerals). It has been found, based on light I-V sweeps, that the perovskite PV light-to-power conversion efficiency may nearly triple with the addition of water compared to a completely dry device.

The water may be added to the lead halide precursor ink at various concentrations depending on the desired characteristics of the resulting perovskite material. In one embodiment, the water may be added in a concentration of about 1 nL/mL to about 1 mL/mL, from about 1 µL/mL to about 0.1 mL/mL, or from about 1 µL/mL to about 20 µL/mL.

The lead halide precursor ink may then be deposited on the desired substrate. Suitable substrate layers may include any of the substrate layers identified earlier in this disclosure. As noted above, the lead halide precursor ink may be deposited through a variety of means, including but not limited to, drop casting, spin coating (spin casting), slot-die printing, ink-jet printing, gravure printing, screen printing, sputtering, PE-CVD, atomic-layer deposition, thermal evaporation, spray coating, and any combination thereof. In certain embodiments, the lead halide precursor ink may be spin-coated onto the substrate at a speed of about 500 rpm to about 10,000 rpm for a time period of about 5 seconds to about 600 seconds. In one embodiment, the lead halide precursor ink may be spin-coated onto the substrate at about 3000 rpm for about 30 seconds. The lead halide precursor ink may be deposited on the substrate at an ambient atmosphere in a humidity range of about 0% relative humidity to about 50% relative humidity. The lead halide precursor ink may then be allowed to dry in a substantially water-free atmosphere, i.e., less than 30% relative humidity, to form a thin film.

The thin film may then be thermally annealed for a time period up to about 24 hours at a temperature of about 20° C. to about 300° C. In one embodiment, the thin film may be thermally annealed for about ten minutes at a temperature of about 50° C. The perovskite material active layer may then be completed by a conversion process in which the precursor film is submerged or rinsed with a solution comprising a solvent or mixture of solvents (e.g., DMF, isopropanol, methanol, ethanol, butanol, chloroform chlorobenzene, dimethylsulfoxide, water) and salt (e.g., methylammonium iodide, formamidinium iodide, guanidinium iodide, 1,2,2-triaminovinylammonium iodide, 5-aminovaleric acid hydroiodide) in a concentration between 0.001M and 10M. In certain embodiments, the thin films may also be thermally post-annealed in the same fashion as in the first line of this paragraph.

In some embodiments, a lead salt precursor may be deposited onto a substrate to form a lead salt thin film. The substrate may have a temperature about equal to ambient temperature or have a controlled temperature between 0° C. and 500° C. The lead salt precursor may be deposited by any of the a variety of methods discussed above with respect to the lead halide precursor ink. In certain embodiments, the deposition of the lead salt precursor may comprise sheet-to-sheet or roll-to-roll manufacturing methodologies. Deposition of the lead salt precursor may be performed in a variety of atmospheres at ambient pressure or at pressures less than atmospheric or ambient (e.g., 1 mTorr to 500 mTorr). The deposition atmosphere may comprise ambient air, a controlled humidity environment (e.g., 0-100 g $H_2O$/$m^3$ of gas), pure argon, pure nitrogen, pure oxygen, pure hydrogen, pure helium, pure neon, pure krypton, pure CO2 or any combination of the preceding gases. A controlled humidity environment may include an environment in which the absolute humidity or the % relative humidity is held at a fixed value, or in which the absolute humidity or the % relative humidity varies according to predetermined set points or a predetermined function. In particular embodiments, deposition may occur in a controlled humidity environment having a % relative humidity greater than or equal to 0% and less than or equal to 50%. In other embodiments, deposition may occur in a controlled humidity environment containing greater than or equal to 0 g $H_2O$/$m^3$ gas and less than or equal to 20 g $H_2O$/$m^3$ gas. Unless described as otherwise, any annealing or deposition step described herein may be carried out under the preceding conditions.

The lead salt precursor may be a liquid, a gas, solid, or combination of these states of matter such as a solution, suspension, colloid, foam, gel, or aerosol. In some embodiments, the lead salt precursor may be a solution containing one or more solvents. For example, the lead salt precursor may contain one or more of N-cyclohexyl-2-pyrrolidone, alkyl-2-pyrrolidone, dimethylformamide, dialkylformamide, dimethylsulfoxide (DMSO), acetonitrile, methanol, ethanol, propanol, butanol, tetrahydrofuran, formamide, tert-butylpyridine, pyridine, alkylpyridine, pyrrolidine, chlorobenzene, dichlorobenzene, dichloromethane, chloroform, and combinations thereof. The lead salt precursor may comprise a single lead salt (e.g., lead (II) iodide, lead (II) thiocyanate) or any combination of those disclosed herein (e.g., $PbI_2$+$PbCl_2$; $PbI_2$+$Pb(SCN)_2$). The lead salt precursor may also contain one or more additives such as an amino acid (e.g., 5-aminovaleric acid hydroiodide), 1,8-diiodooctane, 1,8-dithiooctane, formamidinium halide, acetic acid, trifluoroacetic acid, a methylammonium halide, or water. The lead salt precursor may be allowed to dry in a substantially water-free atmosphere, i.e., less than 30% relative humidity, to form a thin film. The lead salt thin film may then be thermally annealed for the same amount of times and under the same conditions as discussed above with respect to the lead halide precursor ink thin film. The annealing environment may have the same pressures and atmosphere as the lead salt deposition environments and conditions discussed above. In particular embodiments, annealing may occur in a controlled humidity environment having a % relative humidity greater than or equal to 0% and less than or equal to 50%. In other embodiments, annealing may occur in a controlled humidity environment containing greater than or equal to 0 g $H_2O$/$m^3$ gas and less than or equal to 20 g $H_2O$/$m^3$ gas.

After the lead salt precursor is deposited, a second salt precursor (e.g., formamidinium iodide, formamidinium thiocyanate, guanidinium thiocyanate) may be deposited onto the lead salt thin film, where the lead salt thin film may have a temperature about equal to ambient temperature or have a controlled temperature between 0° C. and 500° C. The second salt precursor, in some embodiments, may be deposited at ambient temperature or at elevated temperature between about 25° C. and 125° C. The second salt precursor may be deposited by any of the methods discussed above with respect to the lead halide precursor ink Deposition of the second salt precursor may be in the same environments and under the same conditions as discussed above with respect to the first sale precursor.

In some embodiments the second salt precursor may be a solution containing one or more of the solvents (e.g., one or more of the solvents discussed above with respect to the first lead salt precursor).

After deposition of the lead salt precursor and second salt precursor, the substrate may be annealed. Annealing the substrate may convert the lead salt precursor and second salt precursor to a perovskite material, (e.g. $FAPbI_3$, GAPb $(SCN)_3$, $FASnI_3$). The annealing may occur in the same environment and under the same conditions as the lead salt deposition environments and conditions discussed above. In particular embodiments, annealing may occur in a controlled humidity environment having a % relative humidity greater than or equal to 0% and less than or equal to 50%. In other embodiments, annealing may occur in a controlled humidity environment containing greater than or equal to 0 g $H_2O$/$m^3$ gas and less than or equal to 20 g $H_2O$/$m^3$ gas. In some embodiments, annealing may occur at a temperature greater than or equal to 50° C. and less than or equal to 300° C.

For example, in a particular embodiment, a $FAPbI_3$ perovskite material may be formed by the following process. First a lead (II) halide precursor comprising about a 90:10 mole ratio of $PbI_2$ to $PbCl_2$ dissolved in anhydrous DMF may be deposited onto a substrate by spin-coating or slot-die printing. The lead halide precursor ink may be allowed to dry in a substantially water-free atmosphere, i.e., less than 30% relative humidity, for approximately one hour (+15 minutes) to form a thin film. The thin film may be subsequently thermally annealed for about ten minutes at a temperature of about 50° C. (+10° C.). Next, a formamidinium iodide precursor comprising a 25-60 mg/mL concentration of formamidinium iodide dissolved in anhydrous isopropyl alcohol may be deposited onto the lead halide thin film by spin coating or slot-die printing. After depositing the lead halide precursor and formamidinium iodide precursor, the substrate may be annealed at about 25%.relative humidity (about 4 to 7 g $H_2O$/$m^3$ air) and between about 125° C. and 200° C. to form a formamidinium lead iodide (FAPbI3) perovskite material.

In another embodiment, a perovskite material may comprise C'CPbX3, where C' is one or more Group 1 metals (e.g., Li, Na, K, Rb, Cs). In a particular embodiment M' may be cesium (Cs). In yet other embodiments, a perovskite material may comprise C'vCwPbyXz, where C' is one or more Group 1 metals and v, w, y, and z represent real numbers between 1 and 20. In certain embodiments, the perovskite material may be deposited as an active layer in a PV device by, for example, drop casting, spin casting, gravure coating, blade coating, reverse gravure coating, slot-die printing, screen printing, or ink-jet printing onto a substrate layer.

First, a lead halide solution is formed. The lead halide solution may be prepared in any of the same methods and with similar compositions as the lead halide precursor ink discussed above.

Other lead salt precursors (e.g., those discussed above with respect to lead halide precursor inks) may be used in conjunction with or in lieu of lead halide salts to form a lead salt solution.

Next, a Group 1 metal halide solution is formed. An amount of Group 1 metal halide may be massed in a clean, dry vessel in a controlled atmosphere environment. Suitable Group 1 metal halides include, but are not limited to, cesium iodide, cesium bromide, cesium chloride, cesium fluoride, rubidium iodide, rubidium bromide, rubidium chloride, rubidium fluoride, lithium iodide, lithium bromide, lithium chloride, lithium fluoride, sodium iodide, sodium bromide, sodium chloride, sodium fluoride, potassium iodide, potassium bromide, potassium chloride, potassium fluoride. The Group 1 metal halide may comprise a single species of Group 1 metal halide or it may comprise a Group 1 metal halide mixture in a precise ratio.

Alternatively, other Group 1 metal salt precursors may be used in conjunction with or in lieu of Group 1 metal halide salts to form a Group 1 metal salt solution. Suitable precursor Group 1 metal salts may comprise any combination of Group 1 metals and the following anions: nitrate, nitrite, carboxylate, acetate, formate, oxalate, sulfate, sulfite, thiosulfate, phosphate, tetrafluoroborate, hexafluorophosphate, tetra(perfluorophenyl) borate, hydride, oxide, peroxide, hydroxide, nitride, arsenate, arsenite, perchlorate, carbonate, bicarbonate, chromate, dichromate, iodate, bromate, chlorate, chlorite, hypochlorite, hypobromite, cyanide, cyanate, isocyanate, fulminate, thiocyanate, isothiocyanate, azide, tetracarbonylcobaltate, carbamoyldicyanomethanide, dicyanonitrosomethanide, dicyanamide, tricyanomethanide, amide, and permanganate.

A solvent may then be added to the vessel to dissolve the Group 1 metal halide solids to form the Group 1 metal halide solution. Suitable solvents include, but are not limited to, dry N-cyclohexyl-2-pyrrolidone, alkyl-2-pyrrolidone, dimethylformamide (DMF), dialkylformamide, dimethylsulfoxide (DMSO), acetonitrile, methanol, ethanol, propanol, butanol, tetrahydrofuran, formamide, tert-butylpyridine, pyridine, alkylpyridine, pyrrolidine, chlorobenzene, dichlorobenzene, dichloromethane, chloroform, and combinations thereof. In one embodiment, the lead solids are dissolved in dry dimethylsulfoxide (DMSO). The Group 1 metal halide solids may be dissolved at a temperature between about 20° C. to about 150° C. In one embodiment, the Group 1 metal halide solids are dissolved at room temperature (i.e., about 25° C.). The Group 1 metal halide solids may be dissolved for as long as necessary to form a solution, which may take place over a time period up to about 72 hours. The resulting solution forms the Group 1 metal halide solution. In some embodiments, the Group 1 metal halide solution may have a Group 1 metal halide concentration between about 0.001M and about 10M, or about 1 M. In some embodiments, the Group 1 metal halide solution may further comprise an amino acid (e.g., 5-aminovaleric acid, histidine, glycine, lysine), an amino acid hydrohalide (e.g., 5-amino valeric acid hydrochloride), an IFL surface-modifying (SAM) agent (such as those discussed earlier in the specification), or a combination thereof.

Next, the lead halide solution and the Group 1 metal halide solution are mixed to form a thin-film precursor ink. The lead halide solution and Group 1 metal halide solution may be mixed in a ratio such that the resulting thin-film precursor ink has a molar concentration of the Group 1 metal halide that is between 0% and 25% of the molar concentration of the lead halide. In particular embodiments, the thin-film precursor ink may have a molar concentration of the Group 1 metal halide that is 1%, 5%, 10%, 15%, 20%, or 25% of the molar concentration of the lead halide. In some embodiments the lead halide solution and the Group 1 metal halide solution may be stirred or agitated during or after mixing.

The thin-film precursor ink may then be deposited on the desired substrate through any of the deposition means discussed above. Suitable substrate layers may include any of the substrate layers identified earlier in this disclosure. In certain embodiments, the thin-film precursor ink may be spin-coated onto the substrate at a speed of about 500 rpm to about 10,000 rpm for a time period of about 5 seconds to about 600 seconds. In one embodiment, the thin-film precursor ink may be spin-coated onto the substrate at about 3000 rpm for about 30 seconds. The thin-film precursor ink may be deposited on the substrate at an ambient atmosphere in a humidity range of about 0% relative humidity to about 50% relative humidity. The thin-film precursor ink may then be allowed to dry in a substantially water-free atmosphere, i.e., less than 30% relative humidity or 7 g $H2O/m^3$, to form a thin film.

The thin film can then be thermally annealed for a time period up to about 24 hours at a temperature of about 20° C. to about 300° C. In one embodiment, the thin film may be thermally annealed for about ten minutes at a temperature of about 50° C. The perovskite material active layer may then be completed by a conversion process in which the precursor film is submerged or rinsed with a salt solution comprising a solvent or mixture of solvents (e.g., DMF, isopropanol, methanol, ethanol, butanol, chloroform chlorobenzene, dimethylsulfoxide, water) and salt (e.g., methylammonium iodide, formamidinium iodide, guanidinium iodide, 1,2,2-triaminovinylammonium iodide, 5-aminovaleric acid hydroiodide) in a concentration between 0.001M and 10M. In certain embodiments, the perovskite material thin films can also be thermally post-annealed in the same fashion as in the first line of this paragraph.

In some embodiments, the salt solution may be prepared by massing the salt in a clean, dry vessel in a controlled atmosphere environment. Suitable salts include, but are not limited to, methylammonium iodide, formamidinium iodide, guanidinium iodide, imidazolium iodide, ethene tetramine iodide, 1,2,2-triaminovinylammonium iodide, and 5-aminovaleric acid hydroiodide. Other suitable salts may include any organic cation described above in the section entitled "Perovskite Material." The salt may comprise a single species of salt or it may comprise a salt mixture in a precise ratio. Next, a solvent may then be added to the vessel to dissolve the salt solids to form the salt solution. Suitable solvents include those listed in the preceeding paragraph, and combinations thereof. In one embodiment, formamidinium iodide salt solids are dissolved in isopropanol. The salt solids may be dissolved at a temperature between about 20° C. to about 150° C. In one embodiment, the salt solids are dissolved at room temperature (i.e. about 25° C.). The salt solids may be dissolved for as long as necessary to form a solution, which may take place over a time period up to about 72 hours. The resulting solution forms the salt solution. In some embodiments, the salt solution may have a salt concentration between about 0.001M and about 10M. In one embodiment, the salt solution has a salt concentration of about 1 M.

For example, using the process described above with a lead (II) iodide solution, a cesium iodide solution, and a methylammonium (MA) iodide salt solution may result in a perovskite material having the a formula of $Cs_iMA_{1-i}PbI_3$, where i equals a number between 0 and 1. As another example, using a lead (II) iodide solution, a rubidium iodide solution, and a formamidinium (FA) iodide salt solution may result in a perovskite material having the a formula of $Rb_iFA_{1-i}PbI_3$, where i equals a number between 0 and 1. As another example, using a lead (II) iodide solution, a cesium iodide solution, and a formamidinium (FA) iodide salt solution may result in a perovskite material having the a formula of $Cs_iFA_{1-i}PbI_3$, where i equals a number between 0 and 1. As another example, using a lead (II) iodide solution, a potassium iodide solution, and a formamidinium (FA) iodide salt solution may result in a perovskite material having the a formula of $KiFA1-iPbI3$, where i equals a number between 0 and 1. As another example, the using a lead (II) iodide solution, a sodium iodide solution, and a formamidinium (FA) iodide salt solution may result in a perovskite material having the a formula of $Na_iFA_{1-i}PbI_3$, where i equals a number between 0 and 1. As another example, the using a lead (II) iodide-lead (II) chloride mixture solution, a cesium iodide solution, and a formamidinium (FA) iodide salt solution may result in a perovskite material having the a formula of $Cs_iFA_{1-i}PbI_{3-y}Cl_y$, where i equals a number between 0 and 1 and y represents a number between 0 and 3.

In a particular embodiment, the lead halide solution as described above may have a ratio of 90:10 of $PbI_2$ to $PbCl_2$ on a mole basis. A cesium iodide (CsI) solution may be added to the lead halide solution by the method described above to form a thin film precursor ink with 10 mol % CsI. A $FAPbI_3$ perovskite material may be produced according to the method described above using this thin film precursor solution. The addition of cesium ions through the CsI solution as described above may cause chloride anions and cesium atoms to incorporate into the $FAPbI_3$ crystal lattice. This may result in a greater degree of lattice contraction compared to addition of cesium or rubidium ions as described above without addition of chloride ions. Table 1 below shows lattice parameters for $FAPbI_3$ perovskite materials with 10 mol % rubidium and 20 mol % chloride (e.g. 10 mol % $PbCl_2$), 10 mol % cesium, and 10 mol % cesium with 20 mol % chloride, wherein the mol % concentration represents the concentration of the additive with respect to the lead atoms in the lead halide solution. As can be seen in Table 1, the $FAPbI_3$ perovskite material with cesium and chloride added has smaller lattice parameters than the other two perovskite material samples.

TABLE 1

| Sample Details | (001) d-spacing | (002) d-spacing |
| --- | --- | --- |
| 10 mol % RbI + 10 mol % PbCl$_2$ | 6.3759(15) | 3.1822(5) |
| 10 mol % CsI + 0 mol % PbCl$_2$ | 6.3425(13) | 3.1736(8) |
| 10 mol % CsI + 10 mol % PbCl$_2$ | 6.3272(13) | 3.1633(4) |

Figure 2:
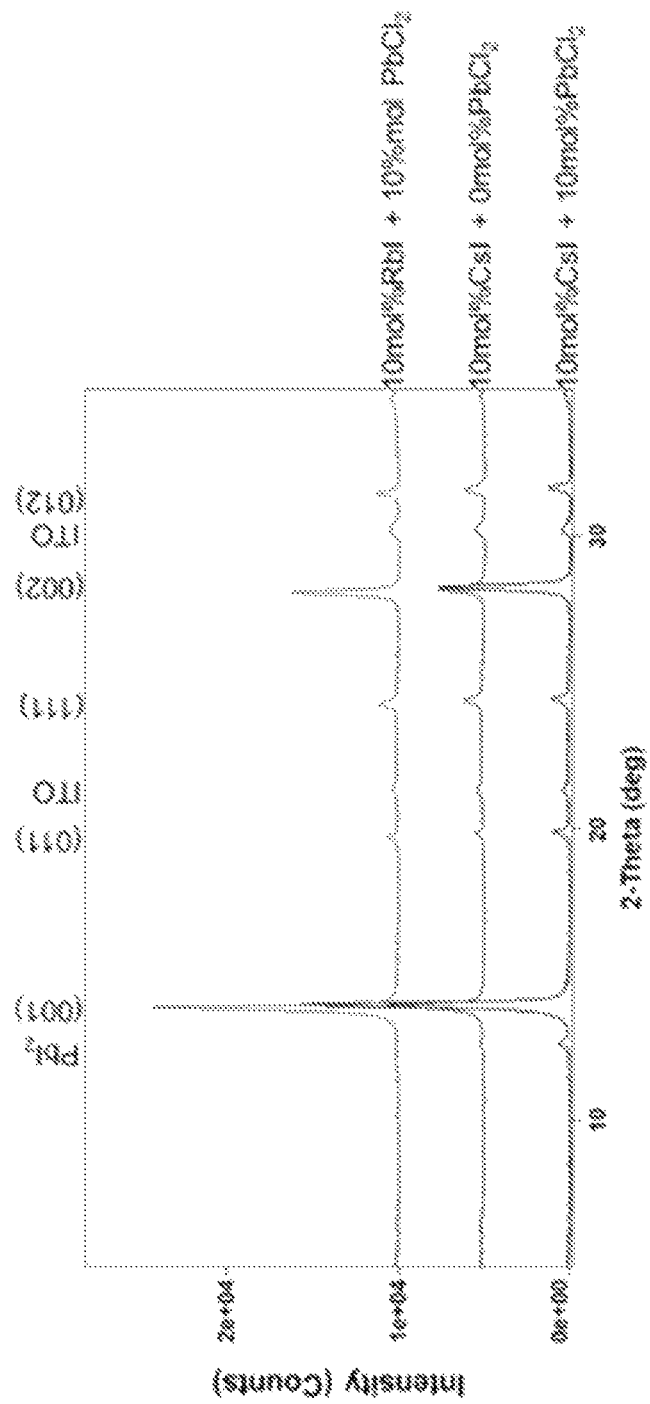
FIG. 2 illustrates x-ray diffraction patterns of perovskites materials according to some embodiments of the present disclosure.

Additionally, data shows that the $FAPbI_3$ perovskite material with rubidium, cesium and/or chloride added has a Pm3-m cubic structure. $FAPbI_3$ perovskites with up to and including 10 mol % Rb and 10 mol % Cl, or 10 mol % Cs, or 10 mol % Cs and 10 mol % Cl have been observed to maintain a cubic Pm3-m cubic crystal structure. FIG. 2 shows x-ray diffraction patterns corresponding to each of the samples presented in Table 1. Tables 2-4 provide the x-ray diffraction peaks and intensity for the three perovskite materials shown in Table 1. The data were collected at ambient conditions on a Rigaku Miniflex 600 using a Cu Kα radiation source at a scan rate of 1.5 degrees 2θ/min.

TABLE 2

| 10 mol % RbI + 10 mol % PbCl$_2$ | | | |
| --- | --- | --- | --- |
| 2-theta (deg) | d (ang.) | Height (cps) | Peak Identity (phase, miller index) |
| | | | PbI2, (001) |
| 13.878(3) | 6.3759(15) | 12605(126) | Perovskite, (001) |
| 19.707(15) | 4.501(3) | 489(25) | Perovskite, (011) |
| 21.320(14) | 4.164(3) | 286(19) | ITO, (112) |
| 24.227(19) | 3.671(3) | 1022(36) | Perovskite, (111) |
| 28.017(4) | 3.1822(5) | 5683(84) | Perovskite, (002) |
| 30.13(4) | 2.964(4) | 344(21) | ITO, (112) |
| 31.403(14) | 2.8464(13) | 913(34) | Perovskite, (012) |

TABLE 3

| 10 mol % CsI & 0 mol % PbCl$_2$ | | | |
| --- | --- | --- | --- |
| 2-theta (deg) | d (ang.) | Height (cps) | Peak Identity phase (miller index) |
| 12.614(14) | 7.012(8) | 99(11) | PbI2, (001) |
| 13.952(3) | 6.3425(13) | 4921(78) | Perovskite, (001) |
| 19.826(12) | 4.475(3) | 392(22) | Perovskite, (011) |
| 21.274(14) | 4.173(3) | 281(19) | ITO, (112) |
| 24.333(15) | 3.655(2) | 1031(36) | Perovskite, (111) |
| 28.094(7) | 3.1736(8) | 2332(54) | Perovskite, (002) |
| 30.15(4) | 2.962(4) | 364(21) | ITO, (112) |
| 31.531(12) | 2.8351(10) | 941(34) | Perovskite, (012) |

TABLE 4

| 10 mol % CsI & 10 mol % PbCl$_2$ | | | |
| --- | --- | --- | --- |
| 2-theta (deg) | d (ang.) | Height (cps) | Peak Identity phase (miller index) |
| 12.635(6) | 7.000(3) | 395(22) | PbI2, (001) |
| 13.985(3) | 6.3272(13) | 13692(131) | Perovskite, (001) |
| 19.867(11) | 4.465(2) | 807(32) | Perovskite, (011) |
| 21.392(13) | 4.150(2) | 254(18) | ITO, (112) |
| 24.41(2) | 3.643(3) | 918(34) | Perovskite, (111) |
| 28.188(4) | 3.1633(4) | 6797(92) | Perovskite, (002) |
| 30.14(4) | 2.963(4) | 348(21) | ITO, (112) |
| 31.633(15) | 2.8262(13) | 1027(36) | Perovskite, (012) |

A geometrically expected x-ray diffraction pattern for cubic Pm3-m material with a lattice constant=6.3375 Å under Cu-Kα radiation is shown in Table 5. As can be seen from the data, the perovskite materials produced with 10 mol % Rb and 10 mol % Cl, 10 mol % Cs, and 10% Cs and 10% Cl each have diffraction patterns conforming to the expected pattern for a cubic, Pm3-m perovskite material.

TABLE 5

Geometrically Expected Diffraction Pattern for Cubic Pm3-m, lattice constant = 6.3375Å; Cu-Kα Radiation)

| 2-Theta (degrees) | d-spacing angstroms | Miller Index |
|---|---|---|
| 13.963 | 6.3375 | (0 0 1) |
| 19.796 | 4.4813 | (0 1 1) |
| 24.306 | 3.659 | (1 1 1) |
| 28.138 | 3.1688 | (0 0 2) |
| 31.541 | 2.8342 | (0 1 2) |

Method of Using Ionic Liquids to Form Perovskite Material Layers

In certain embodiments, ionic liquids may be incorporated into any of the methods discussed herein for forming perovskite materials. In some embodiments, the ionic liquid may include a molten salt having a low melting point. In certain embodiments, the ionic liquid may include a salt having a melting point of 100° C. or less, 80° C. or less, or 60° C. or less. Among the many potential advantages to the methods, compositions and devices of the present disclosure, only some of which are alluded to herein, the use of ionic liquids in forming perovskite materials may enhance the perovskite crystallization process and provide oxygen and water (i.e., hydrophobicity) to the perovskite material, which may result in more robust, durable, and efficient perovskite devices.

In some embodiments, the ionic liquid may include a salt of the general formula AB, where A is one or more cations and B is one or more anions. In certain embodiments, A may include an ammonium, an organic cation of the general formula $[NR_4]+$ where the R groups may be the same or different groups. Suitable R groups include, but are not limited to: hydrogen, methyl, ethyl, propyl, butyl, pentyl group or isomer thereof; any alkane, alkene, or alkyne $C_xH_y$, where x=1-20, y=1-42, cyclic, branched or straight-chain; alkyl halides, CxHyXz, x=1-20, y=0-42, z =1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., pyridine, pyrrole, pyrrolidine, piperidine, tetrahydroquinoline, 2-hexahydropyrimidin-2-ylidenehexahydropyrimidine, octahydropyrazino[2,3-b]pyrazine, pyrazino[2,3-b]pyrazine, quinoxalino[2,3-b]quinoxaline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, serine, histidine, 5-ammoniumvaleric acid) including alpha, beta, gamma, and greater derivatives; any silicon containing group (e.g., siloxane); any alkoxy or group, —OCxHy, where x=0-20, y=1-42; and any halide or pseudohalide: F, Cl, Br, I, SCN, or CN.

In certain embodiments, A of an ionic liquid may include a formamidinium, an organic cation of the general formula $[R_2NCRNR_2]^+$ where the R groups may be the same or different groups. Suitable R groups include, but are not limited to any of the R groups in the preceding paragraph.

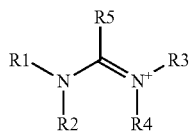

Formula 1

Formula 1 illustrates the structure of a formamidinium cation having the general formula of $[R_2NCRNR_2]^+$ as described above. Formula 2 illustrates examples structures of several formamidinium cations that may serve as a cation "A" in an ionic liquid.

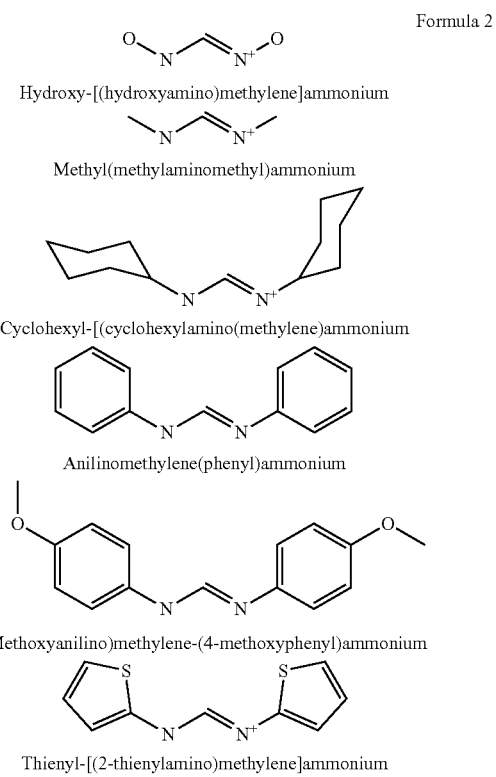

Formula 2

In certain embodiments, A may include a guanidinium, an organic cation of the general formula $[(R_2N)_2C=NR_2]^+$ where the R groups may be the same or different groups. Suitable R groups include, but are not limited to any of the R groups in the preceding paragraphs

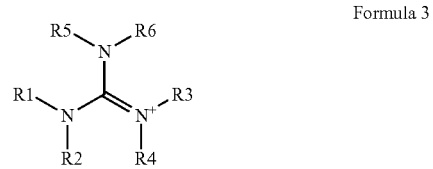

Formula 3

Formula 3 illustrates the structure of a guanidinium cation having the general formula of $[(R_2N)_2C=NR_2]^+$ as described above. Formula 4 illustrates examples of structures of several guanidinium cations that may serve as a cation "A" in an ionic liquid.

Formula 4

[Amino(methylamino)methylene]-methyl-ammonium

[Amino(trifluoromethylamino)methylene]-(trifluoromethyl)ammonium 2,3,5,6-Tetrahydro-1H-imidazol[1,2-a]imidazol-7-ium

[Amino-(cyclohexylamino)methylene]-cyclohexyl-ammonium

[Amino(2-thienylamino)methylene]-(2-thienyl)ammonium

[Amino(anilino)methylene]-phenyl-ammonium

[Amino-(4-methoxyanilino)methylene]-(4-methoxyphenyl)ammonium

In certain embodiments, A may include an ethene tetramine cation, an organic cation of the general formula $[(R_2N)_2C=C(NR_2)_2]^+$ where the R groups may be the same or different groups. Suitable R groups include, but are not limited to any of the R groups in the preceding paragraphs.

Formula 5

Formula 5 illustrates the structure of an ethene tetramine cation having the general formula of $[(R_2N)_2C=C(NR_2)_2]^+$ as described above. Formula 6 illustrates examples of structures of several ethene tetramine ions that may serve as a cation "A" in an ionic liquid.

Formula 6

2-hexahydropyrimidin-2-ylidenehexahydropyrimidine pyrazino[2,3-b] pyrazine 1,2,3,4,5,6,7,8-octahydropyrazino[2,3-b]pyrazine quinoxalino[2,3-b]quinoxaline In certain embodiments, A may include an imidazolium cation, an aromatic, cyclic organic cation of the general formula $[CRNRCRNRCR]^+$ where the R groups may be the same or different groups. Suitable R groups may include, but are not limited to any of the R groups in the preceding paragraphs.

Formula 7

Formula 7 illustrates the structure of an imidazolium cation having the general formula of $[CRNRCRNRCR]^+$ as described above. Formulas 8 and 9 illustrates example structures that may serve as the cation "A" in an ionic liquid.

Formula 8

Formula 9

In certain embodiments, A may include a cation of the general formula $[R_3R_2R_1PNPR_4R_5R_6]^+$ where $R_1$-$R_6$ may be the same or different groups. Suitable R groups may include, but are not limited to any of the R groups in the preceding paragraph. In some embodiments one or more R groups may include

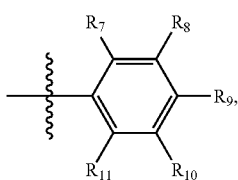

wherein $R_7$-$R_{11}$ may be any suitable R group discussed in the preceding paragraphs.

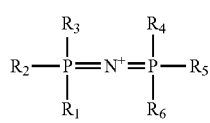

Formula 10

Formula 10 illustrates the structure of a cation having the general formula of $[R_3R_2R_1PNPR_4R_5R_6]^+$ as described above that may be suitable for an ionic liquid.

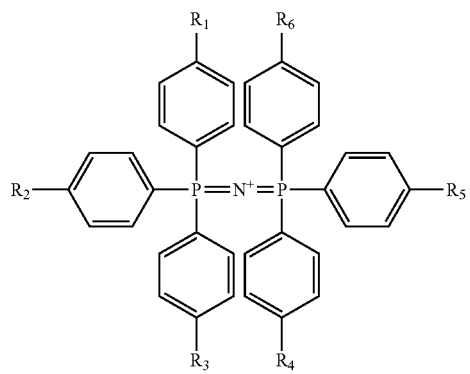

Formula 11

Formula 11 illustrates the general structure of a cation that may be suitable for an ionic liquid. Suitable R groups for $R_1$-$R_6$ for this structure may include, but are not limited to any of the R groups in the preceding paragraphs.

Formula 12 illustrates an example structure that may serve as the cation "A" in an ionic liquid.

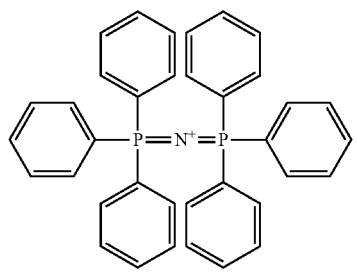

Formula 12

Figure 12:
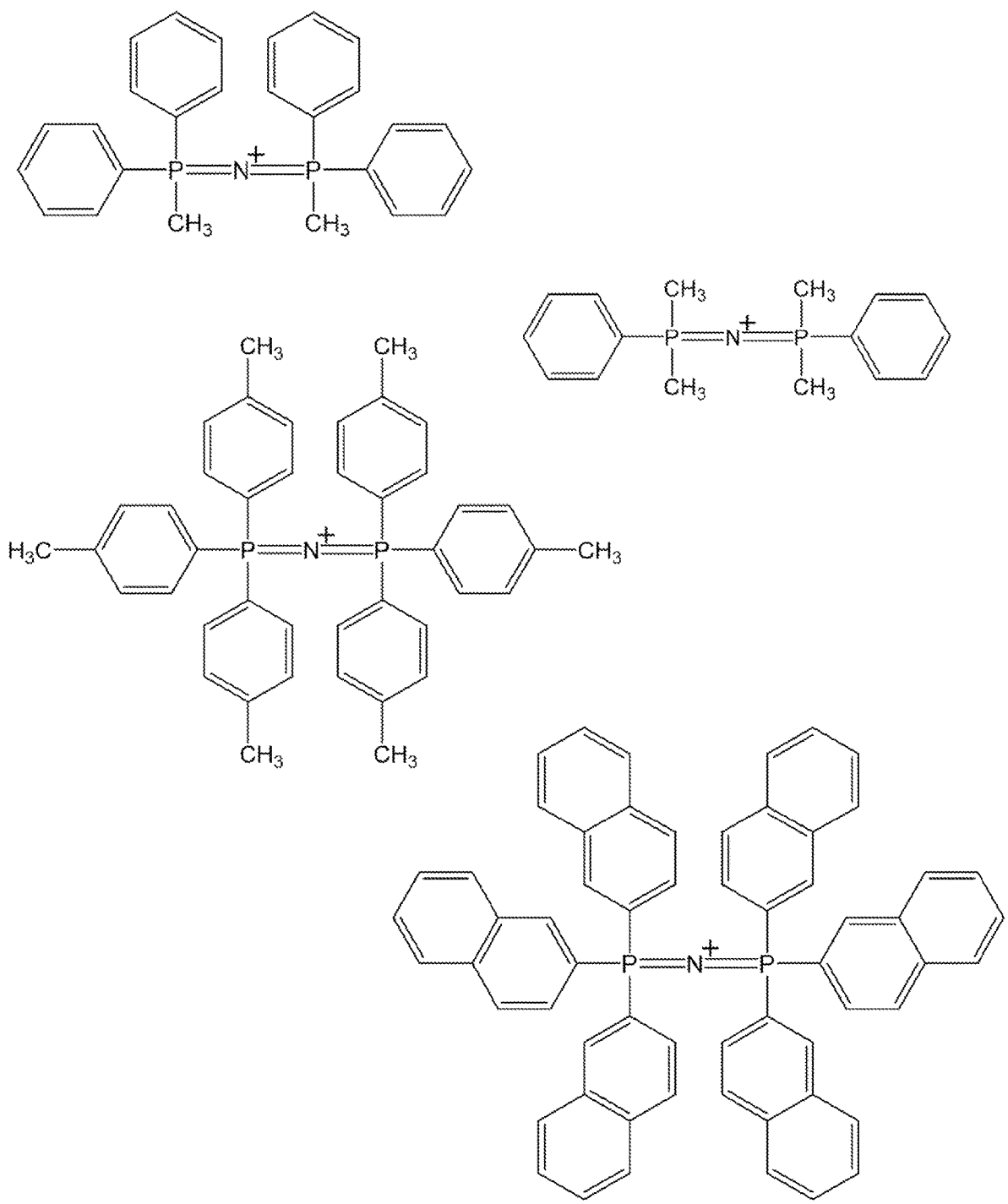
FIG. 12 provides illustrations of the structures of certain organic molecules that may serve as cations for ionic liquids, according to some embodiments of the present disclosure.

FIG. 12 provides illustrations of the additional structures of organic molecules, that may serve as the cation "A" of an ionic liquid, according to certain embodiments.

In some embodiments, the anion B of an ionic liquid may include one or more halides (e.g., chloride). In certain embodiments, B may instead or in addition include a Group 16 anion. In certain embodiments, the Group 16 anion may be oxide, sulfide, selenide, or telluride. In certain embodiments, B may include, but is not limited to be F, Cl, Br, I, SCN, CN, or any other pseudohalide. Other acceptable non-halide anions may include, but are not limited to: nitrate, nitrite, carboxylate, acetate, acetonyl acetonate, formate, oxalate, sulfate, sulfite, thiosulfate, phosphate, tetrafluoroborate, hexafluorophosphate, tetra(perfluorophenyl)borate, hydride, oxide, peroxide, hydroxide, nitride, arsenate, arsenite, perchlorate, carbonate, bicarbonate, chromate, dichromate, iodate, bromate, chlorate, chlorite, hypochlorite, hypobromite, cyanide, cyanate, isocyanate, fulminate, thiocyanate, isothiocyanate, azide, tetracarbonylcobaltate, carbamoyldicyanomethanide, dicyanonitrosomethanide, dicyanamide, tricyanomethanide, amide, and permanganate. In certain embodiments, B may include one or more of bis(trifluoromethane)sulfonimide (TFSI) and tetraphenylborate.

In certain embodiments, B may include a borate anion of the general formula $[BR_1R_2R_3R_4]^-$ where $R_1$-$R_4$ may be the same or different groups. Suitable R groups may include, but are not limited to: halides or pseudohalides (e.g., F, Cl, Br, I, SCN, and CN), alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); and halide-substituted aromatic groups (e.g., pentaflourophenyl). In some embodiments one or more R groups may include F,

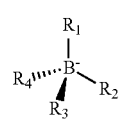

Formula 13 illustrates the structure of an anion having the general formula of $[BR_1R_2R_3R_4]^-$ as described above that may be suitable for an ionic liquid.

Formula 13

Figure 13:
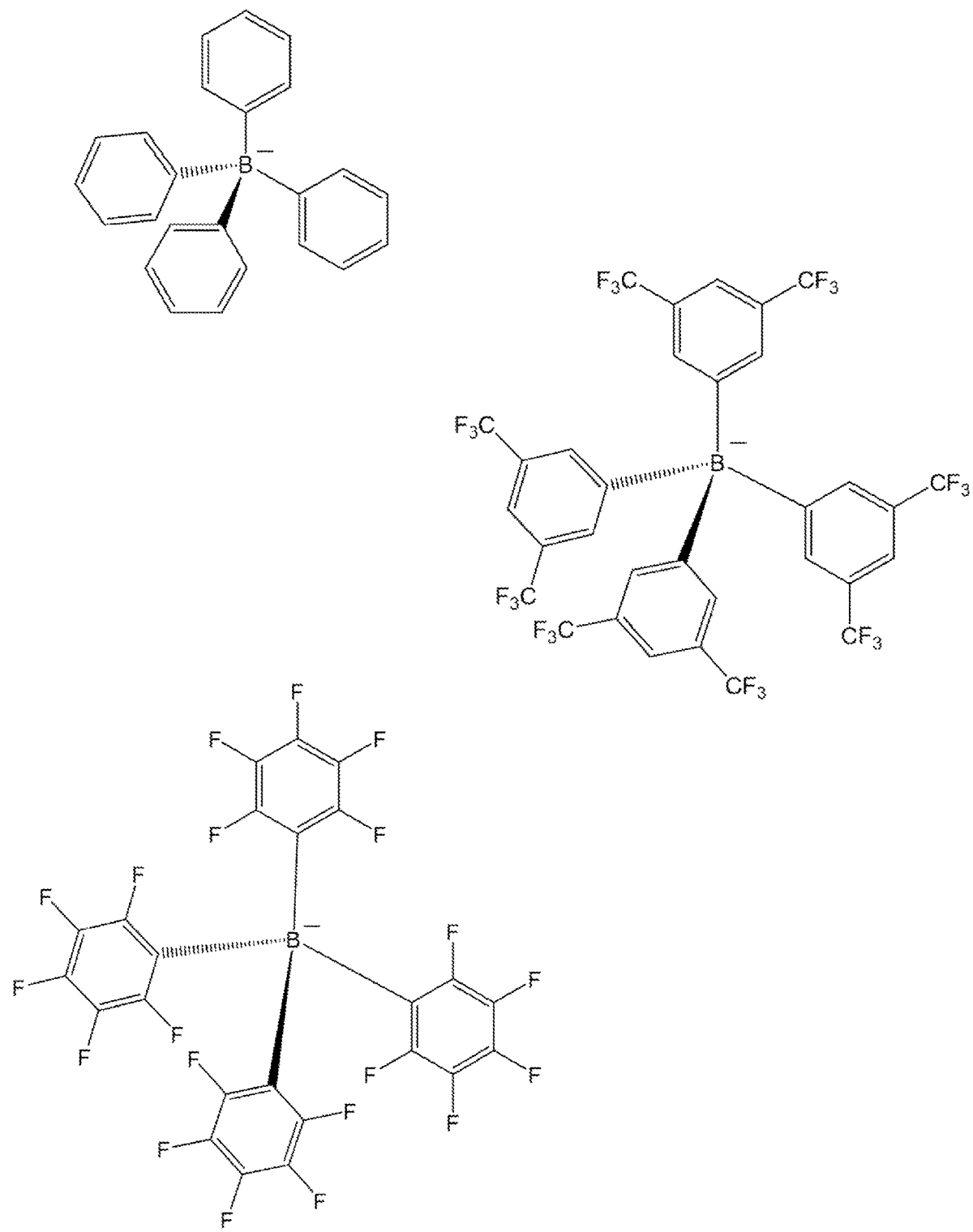
FIG. 13 provides illustrations of the structures of certain organic molecules that may serve as anions for ionic liquids, according to some embodiments of the present disclosure.

FIG. 13 provides illustrations of the additional structures of organic molecules, that may serve as the anion "B" of an ionic liquid, according to certain embodiments.

Ionic liquids may be employed in any of the steps of forming perovskite materials and layers discussed in the present disclosure. A person of skill in the art, with the benefit of this disclosure, would understand the steps in which ionic liquids could be incorporated and be beneficial to perovskite material formation. For example, in certain embodiments, one or more ionic liquids may be added directly to a perovskite precursor ink, added to one or more solvents used in the perovskite formation process, added to one or more salt precursors, and/or added to one or more Group 1 metal halide solutions. In certain embodiments, one or more ionic liquids may be included in a solution including one or more Group 1 metals and a lead halide. In some embodiments, an ionic liquid may be added to a perovskite precursor solution prior to deposition and annealing.

Ionic liquids may be added to a solution (e.g., a lead halide precursor ink) at various concentrations depending on the desired characteristics of the resulting perovskite material. In one embodiment, the ionic liquid may be added in a concentration of from about 0.05 to about 10 mol %, wherein the mol % concentration represents the concentration of the additive with respect to the lead atoms in a lead halide solution. In certain embodiments, the ionic liquid may be added in a concentration of from about 0.01 to about 5 mol %, or from about 0.05 to about 1 mol %. In some embodiments, the ionic liquid may be added in a concentration of less than 10 mol %, less than 5 mol %, or less than 1 mol %.

In some embodiments, perovskite materials formed using ionic liquids may comprise mixed ion formulations where C, M, or X comprise two or more species. For example, a perovskite material may comprise $CMX_{3-x}X'_x$ ($0 \geq x \geq 3$), where: C comprises one or more cations (e.g., an amine, ammonium, methylammonium a Group 1 metal, a Group 2 metal, formamidinium, guanidinium, ethene tetramine, phosphonium, imidazolium, and/or other cations or cation-like compounds); M comprises one or more metals (e.g., Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X and X' comprise one or more anions. In a particular embodiment, C may be Rb, Cs, formamidinium, and methylammonium. In some embodiments, the perovskite material may comprise $CPbI_{3-y}Cl_y$. In certain embodiments, the perovskite material may be deposited as an active layer in a PV device by, for example, drop casting, spin casting, gravure coating, blade coating, reverse gravure coating, slot-die printing, screen printing, or ink-jet printing onto a substrate layer using the steps described below.

An example of forming perovskite materials including ionic liquids is described below. First, a lead halide solution is formed. An amount of lead halide may be massed in a clean, dry vessel in a controlled atmosphere environment. Suitable lead halides include, but are not limited to, lead (II) iodide, lead (II) bromide, lead (II) chloride, and lead (II) fluoride. The lead halide may comprise a single species of lead halide or it may comprise a lead halide mixture in a precise ratio. In one embodiment the lead halide may comprise lead (II) iodide. In certain embodiments, the lead halide mixture may comprise any binary, ternary, or quaternary ratio of 0.001-100 mol % of iodide, bromide, chloride, or fluoride. In one embodiment, the lead halide mixture may comprise lead (II) chloride and lead (II) iodide in a ratio of about 10:90 mol:mol. In other embodiments, the lead halide mixture may comprise lead (II) chloride and lead (II) iodide in a ratio of about 5:95, about 7.5:92.5, or about 15:85 mol:mol. Alternatively, other lead salt precursors may be used in conjunction with or in lieu of lead halide salts to form a lead salt solution. Suitable precursor lead salts may comprise any combination of lead (II) or lead(IV) and the following anions: nitrate, nitrite, carboxylate, acetate, formate, oxalate, sulfate, sulfite, thiosulfate, phosphate, tetrafluoroborate, hexafluorophosphate, tetra(perfluorophenyl) borate, hydride, oxide, peroxide, hydroxide, nitride, arsenate, arsenite, perchlorate, carbonate, bicarbonate, chromate, dichromate, iodate, bromate, chlorate, chlorite, hypochlorite, hypobromite, cyanide, cyanate, isocyanate, fulminate, thiocyanate, isothiocyanate, azide, tetracarbonylcobaltate, carbamoyldicyanomethanide, dicyanonitrosomethanide, dicyanamide, tricyanomethanide, amide, and permanganate. The lead salt solution may further comprise a lead (II) or lead (IV) salt in mole ratios of 0 to 100% to the following metal ions Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr as a salt of the aforementioned anions.

In certain embodiments, one or more ionic liquids may be added to the lead halide prior to the addition of any other additives (e.g., a solvent). A solvent may then be added to the vessel to dissolve the lead halide solids to form the lead halide solution. In another embodiment, one or more ionic liquids may be added to the lead halide solution after the addition of the solvent, concurrently with the solvent, or first mixed with the solvent prior to introduction to the lead halide. Suitable solvents include, but are not limited to, dry N-cyclohexyl-2-pyrrolidone, alkyl-2-pyrrolidone, dimethylformamide (DMF), dialkylformamide, dimethylsulfoxide (DMSO), acetonitrile, methanol, ethanol, propanol, butanol, tetrahydrofuran, formamide, tert-butylpyridine, pyridine, alkylpyridine, pyrrolidine, chlorobenzene, dichlorobenzene, dichloromethane, chloroform, and combinations thereof. In one embodiment, the lead solids are dissolved in dry dimethylformamide (DMF). The lead halide solids may be dissolved at a temperature between about 20° C. to about 150° C. In one embodiment, the lead halide solids are dissolved at about 85° C. The lead halide solids may be dissolved for as long as necessary to form a solution, which may take place over a time period up to about 72 hours. The resulting solution forms the base of the lead halide precursor ink. In some embodiments, the lead halide precursor ink may have a lead halide concentration between about 0.001M and about 1OM. In one embodiment, the lead halide precursor ink has a lead halide concentration of about 1 M. In some embodiments, the lead halide solution may further comprise an amino acid (e.g., 5-aminovaleric acid, histidine, glycine, lysine), an amino acid hydrohalide (e.g., 5-amino valeric acid hydrochloride), an IFL surface-modifying (SAM) agent (such as those discussed earlier in the specification), or a combination thereof.

Next, a Group 1 metal halide solution is formed. An amount of Group 1 metal halide may be massed in a clean, dry vessel in a controlled atmosphere environment. Suitable Group 1 metal halides include, but are not limited to, cesium iodide, cesium bromide, cesium chloride, cesium fluoride, rubidium iodide, rubidium bromide, rubidium chloride, rubidium fluoride, lithium iodide, lithium bromide, lithium chloride, lithium fluoride, sodium iodide, sodium bromide, sodium chloride, sodium fluoride, potassium iodide, potassium bromide, potassium chloride, potassium fluoride. The Group 1 metal halide may comprise a single species of Group 1 metal halide or it may comprise a Group 1 metal halide mixture in a precise ratio. In one embodiment the Group 1 metal halide may comprise cesium iodide. In another embodiment the Group 1 metal halide may comprise rubidium iodide. In another embodiment the Group 1 metal halide may comprise sodium iodide. In another embodiment the Group 1 metal halide may comprise potassium iodide. In some embodiments, the Group 1 metal halides may be massed in a clean, dry vessel along with the lead halide prior to addition of other additives (e.g., an ionic liquid or solvent). In some embodiments, the Group 1 metal halides and lead halides may be weighed and added in a particular order. In certain embodiments, the lead halide may be weighed and added to the vessel prior to the addition of any Group 1 metal halides.

Alternatively, other Group 1 metal salt precursors may be used in conjunction with or in lieu of Group 1 metal halide salts to form a Group 1 metal salt solution. Suitable precursor Group 1 metal salts may comprise any combination of Group 1 metals and the following anions: nitrate, nitrite, carboxylate, acetate, formate, oxalate, sulfate, sulfite, thiosulfate, phosphate, tetrafluoroborate, hexafluorophosphate, tetra(perfluorophenyl) borate, hydride, oxide, peroxide, hydroxide, nitride, arsenate, arsenite, perchlorate, carbonate, bicarbonate, chromate, dichromate, iodate, bromate, chlorate, chlorite, hypochlorite, hypobromite, cyanide, cyanate, isocyanate, fulminate, thiocyanate, isothiocyanate, azide, tetracarbonylcobaltate, carbamoyldicyanomethanide, dicyanonitrosomethanide, dicyanamide, tricyanomethanide, amide, and permanganate.

A solvent may then be added to the vessel to dissolve the Group 1 metal halide solids to form the Group 1 metal halide solution. In certain embodiments, one or more ionic liquids are added to the Group 1 metal halide solids or to the Group 1 metal halide solution after the addition of the solvent. In another embodiment, one or more ionic liquids may be added concurrently with the solvent, or first added to the solvent prior to introducing the solvent to the lead halide solution. Suitable solvents include, but are not limited to, dry N-cyclohexyl-2-pyrrolidone, alkyl-2-pyrrolidone, dimethylformamide (DMF), dialkylformamide, dimethylsulfoxide (DMSO), acetonitrile, methanol, ethanol, propanol, butanol, tetrahydrofuran, formamide, tert-butylpyridine, pyridine, alkylpyridine, pyrrolidine, chlorobenzene, dichlorobenzene, dichloromethane, chloroform, and combinations thereof. In one embodiment, the lead solids are dissolved in dry dimethylsulfoxide (DMSO). The Group 1 metal halide solids may be dissolved at a temperature between about 20° C. to about 150° C. In one embodiment, the Group 1 metal halide solids are dissolved at room temperature (i.e., about 25° C.). The Group 1 metal halide solids may be dissolved for as long as necessary to form a solution, which may take place over a time period up to about 72 hours. The resulting solution forms the Group 1 metal halide solution. In some embodiments, the Group 1 metal halide solution may have a Group 1 metal halide concentration between about 0.001M and about 1OM. In one embodiment, the Group I metal halide solution has a Group 1 metal halide concentration of about 1 M. In some embodiments, the Group 1 metal halide solution may further comprise an amino acid (e.g., 5-aminovaleric acid, histidine, glycine, lysine), an amino acid hydrohalide (e.g., 5-amino valeric acid hydrochloride), an IFL surface-modifying (SAM) agent (such as those discussed earlier in the specification), or a combination thereof.

Next, the lead halide solution and the Group 1 metal halide solution are mixed to form a lead halide precursor ink. In certain embodiments, one or more ionic liquids may be added to the lead halide precursor ink. The lead halide solution and Group 1 metal halide solution may be mixed in a ratio such that the resulting thin-film precursor ink has a molar concentration of the Group 1 metal halide that is between 0% and 25% of the molar concentration of the lead halide. In particular embodiments, the lead halide precursor ink may have a molar concentration of the Group 1 metal halide that is 1% of the molar concentration of the lead halide. In particular embodiments, the lead halide precursor ink may have a molar concentration of the Group 1 metal halide that is 5% of the molar concentration of the lead halide. In particular embodiments, the lead halide precursor ink may have a molar concentration of the Group 1 metal halide that is 10% of the molar concentration of the lead halide. In particular embodiments, the lead halide precursor ink may have a molar concentration of the Group 1 metal halide that is 15% of the molar concentration of the lead halide. In particular embodiments, the thin-film precursor ink may have a molar concentration of the Group 1 metal halide that is 20% of the molar concentration of the lead halide. In particular embodiments, the lead halide precursor ink may have a molar concentration of the Group 1 metal halide that is 25% of the molar concentration of the lead halide. In some embodiments the lead halide solution, the Group 1 metal halide solution, and/or one or more ionic liquids may be stirred or agitated during or after mixing. In other embodiments, the components of the lead halide solution, Group 1 metal halide solution, and ionic liquid may be added together in a single solution (along with one or more solvents) to form the lead halide precursor ink.

The lead halide precursor ink including the ionic liquid may then be deposited on the desired substrate. Suitable substrate layers may include any of the substrate layers identified earlier in this disclosure. As noted above, the lead halide precursor ink may be deposited through a variety of means, including but not limited to drop casting, spin casting, gravure coating, blade coating, reverse gravure coating, slot-die printing, screen printing, or ink-jet printing. In certain embodiments, the lead halide precursor ink may be spin-coated onto the substrate at a speed of about 500 rpm to about 10,000 rpm for a time period of about 5 seconds to about 600 seconds. In one embodiment, the lead halide precursor ink may be spin-coated onto the substrate in a two-step program. In some embodiments, an anti-solvent may be added to the substrate during one or more of the steps. For example, in one embodiment, the thin-film precursor ink may be spin-coated at 1000 rpm and 4000 rpm for about 12 seconds and 25 seconds, respectively, and a chlorobenzene anti-solvent may be added during the second step. The thin-film precursor ink may be deposited on the substrate at an ambient atmosphere in a humidity range of about 0% relative humidity to about 50% relative humidity, of about 0.01% relative humidity to about 50% relative humidity, of about 0.1% relative humidity to about 50% relative humidity, or from about 1% relative humidity to about 50% relative humidity. In some embodiments, the thin-film precursor ink may be deposited on the substrate at an ambient atmosphere with a humidity greater than 0% relative humidity. The lead halide precursor ink may then be allowed to dry in a substantially water-free atmosphere, i.e., less than 30% relative humidity or 7 g H2O/m3, to form a thin film.

The lead halide precursor ink can then be thermally annealed for a time period up to about 24 hours at a temperature of about 20° C. to about 300° C. In one embodiment, the film may be thermally annealed for about thirty minutes at a temperature of about 100° C. The perovskite material active layer may then be completed by a conversion process in which the precursor film is submerged or rinsed with a salt solution comprising a solvent or mixture of solvents (e.g., DMF, isopropanol, methanol, ethanol, butanol, chloroform chlorobenzene, dimethylsulfoxide, water) and salt (e.g., methylammonium iodide, formamidinium iodide, guanidinium iodide, 1,2,2-triaminovinylammonium iodide, 5-aminovaleric acid hydroiodide) in a concentration between about 0.001M and 1OM. In certain embodiments, the perovskite material thin films can also be thermally post-annealed in the same fashion as in the first line of this paragraph.

FIGS. 7-11 illustrate current-voltage and current density-voltage scans and associated testing data for photovoltaic devices incorporating perovskite materials formed using ionic liquids of the present disclosure. The devices used to generate the scans of FIGS. 7-11 were formed using the method described below.

According to this example, FTO substrates were first washed with detergent, deionized water, acetone and isopropanol by ultrasonication, then treated with an UV/Ozone cleaner for 15 min. The $TiO_2$ compact layers ($cp$-$TiO_2$) were deposited onto the FTO by spray pyrolysis using a titanium diisopropoxide bis(acetylacetonate) solution, which was diluted in 2-propanol at a 1:18 volume ratio at 500° C. and annealed in situ for 30 minutes. The mesoporous $TiO_2$ ($mp$-$TiO_2$) solution, composed of 1 g of $TiO_2$ paste diluted in a 10 mL anhydrous ethanol solution, was then deposited onto the $cp$-$TiO_2$/FTO substrate by a one-step spin-coating process at 4,500 rpm for 20 seconds. After annealing at 125° C. for 30 minutes, the deposited $TiO_2$ films were gradually heated to 500° C. in air, and then baked for 20 minutes. $SnO_2$ layers were then deposited onto the substrate by spin-coating 0.1 M of a $SnCl4$ aqueous solution in a one-step process at 3,000 rpm for 20 seconds. Next, the substrates were transferred to a hotplate and held at a temperature between 150° C. and 190° C. for one hour. The substrates were then treated with UV/Ozone for 30 minutes.

Next, lead halide precursor solutions (with or without ionic liquids) were prepared by dissolving $PbI_2$ (1.35 M), RbI (0.05 M), CsI (0.05 M), FAI (1.15 M) and MACl (0.10 M) in a mixed solvent of DMF: DMSO at a 3:1 volume ratio. In this example, the solids were all weighed and added in the following order: $PbI_2$, RbI, CsI, FAI and MACl. Next, DMF was added, followed by DMSO. In other embodiments, DMSO could be added prior to DMF.

Figure 5:
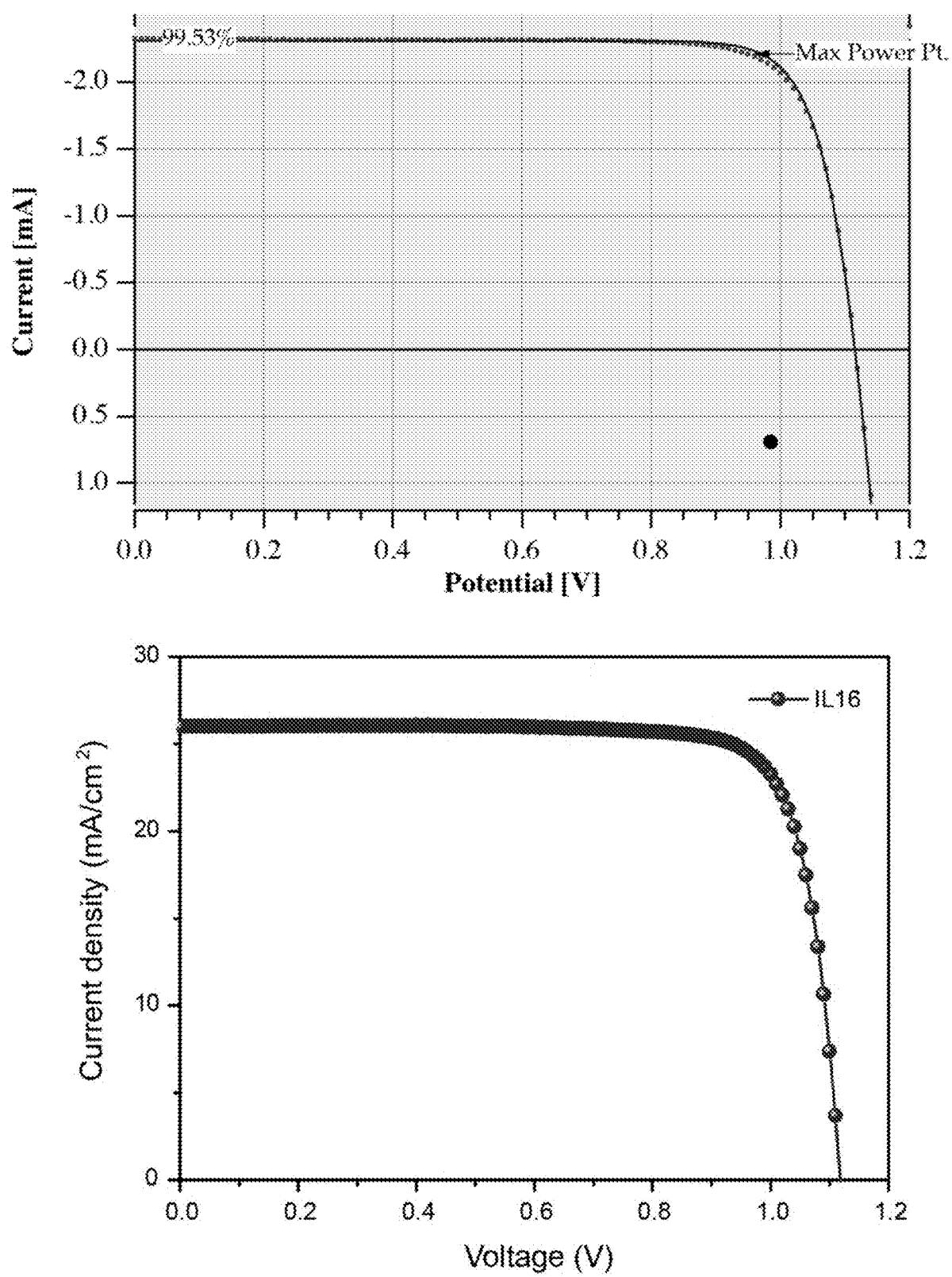
FIG. 5 illustrates current-voltage (I-V) and current density-voltage (J-V) scans of a perovskite material photovoltaic device according to some embodiments of the present disclosure.
Figure 6:
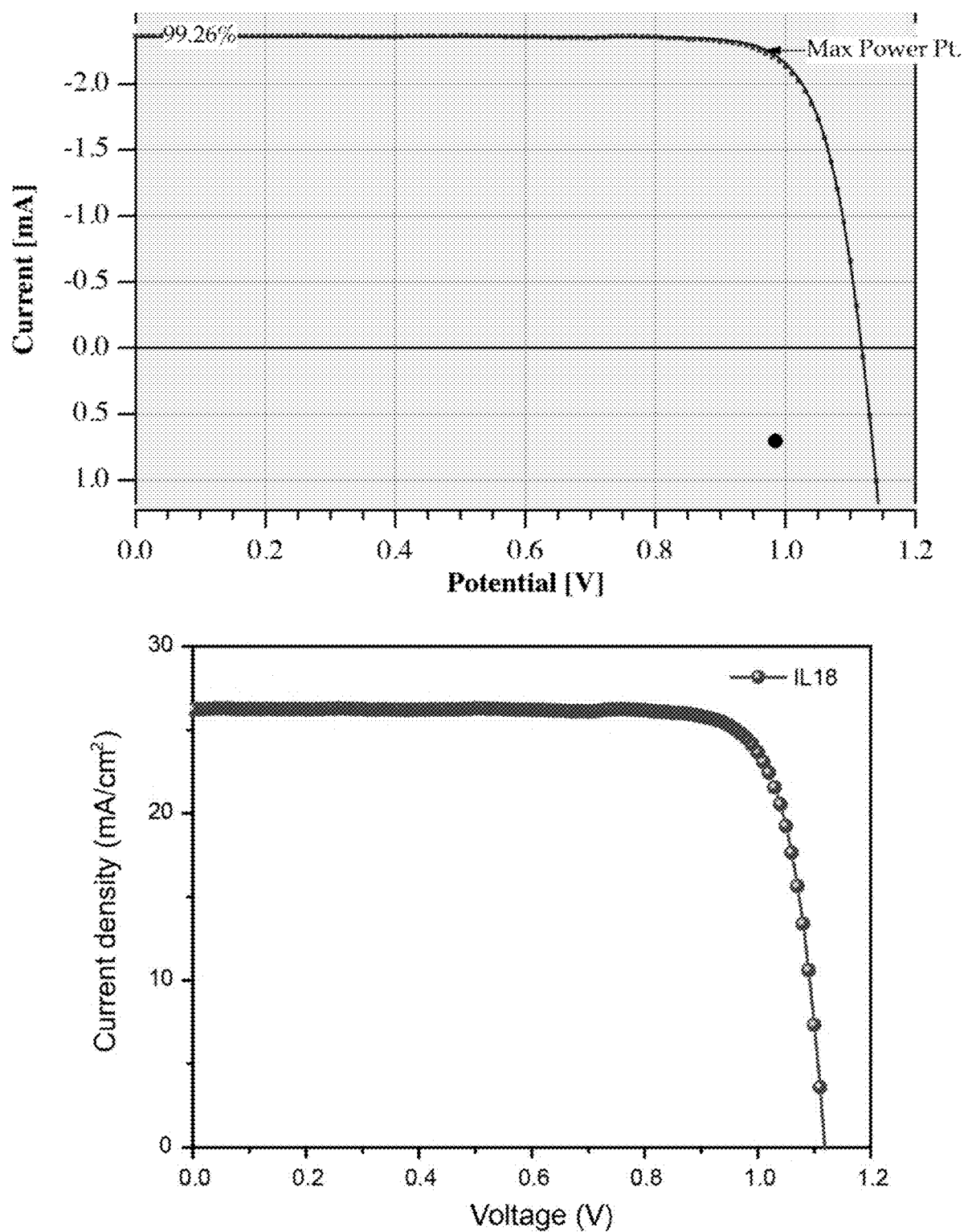
FIG. 6 illustrates current-voltage (I-V) and current density-voltage (J-V) scans of a perovskite material photovoltaic device according to some embodiments of the present disclosure.
Figure 7:
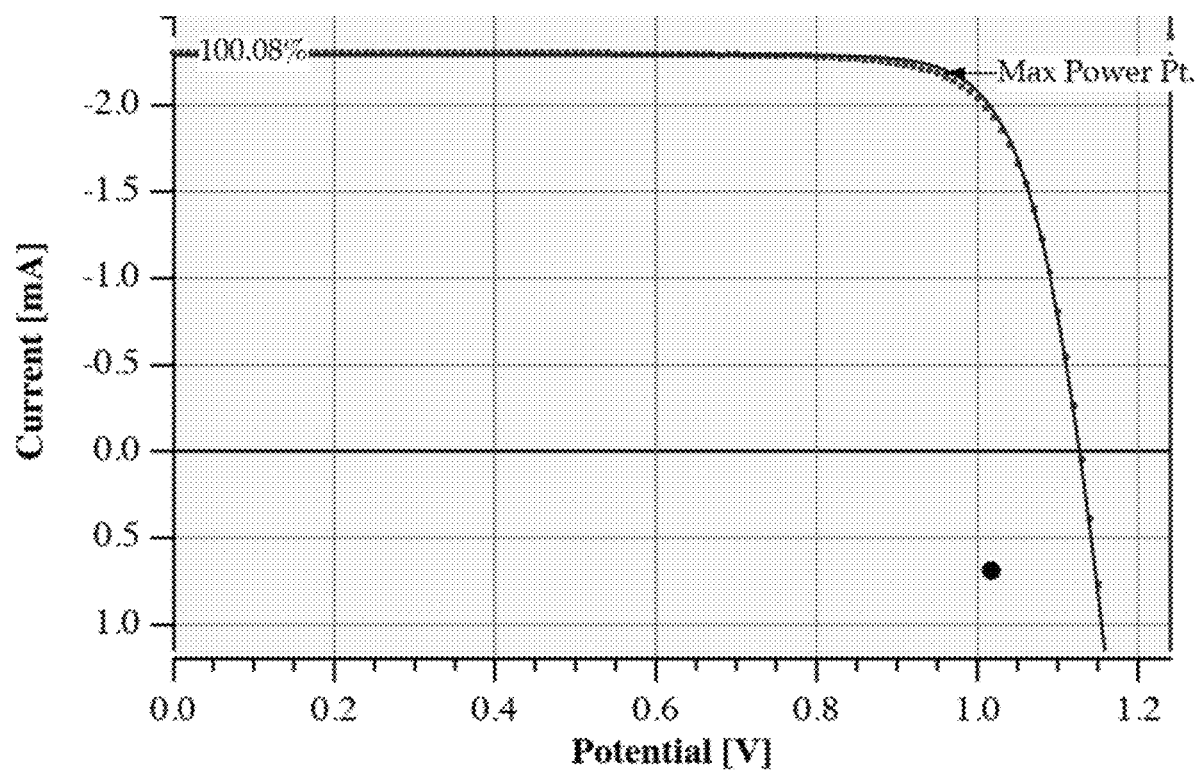
FIG. 7 illustrates a current-voltage (I-V) scan and additional testing data of a perovskite material photovoltaic device according to some embodiments of the present disclosure.
Figure 8:
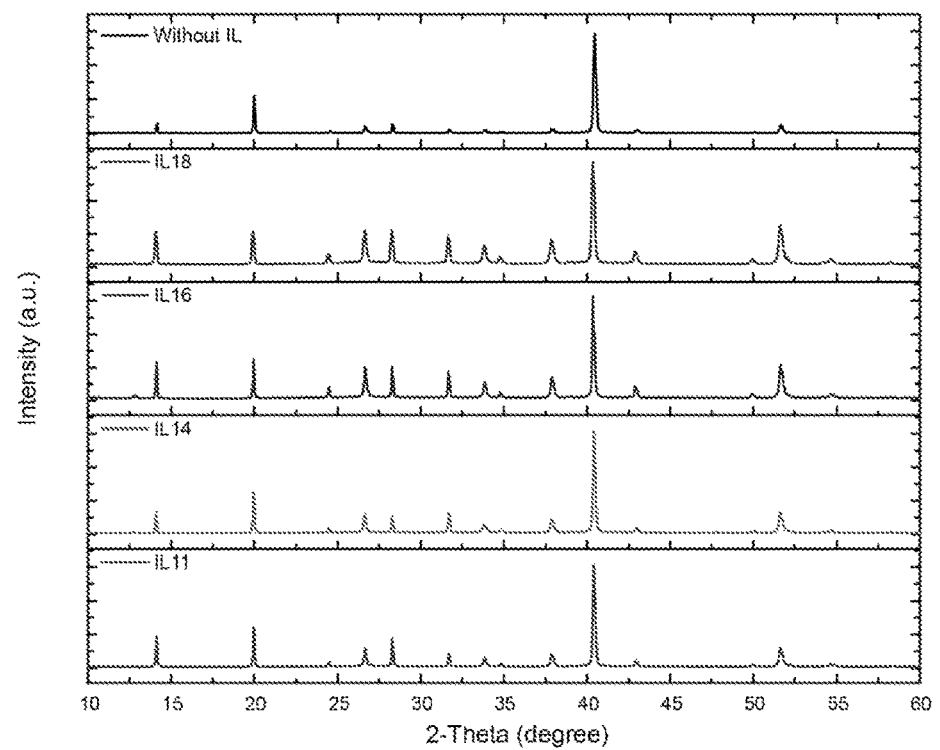
FIG. 8 is an illustration of x-ray diffraction peaks (XRD) spectra and UV-Vis spectra for perovskites devices manufactured with or without ionic liquids as according to some embodiments of the present disclosure.
Figure 8:
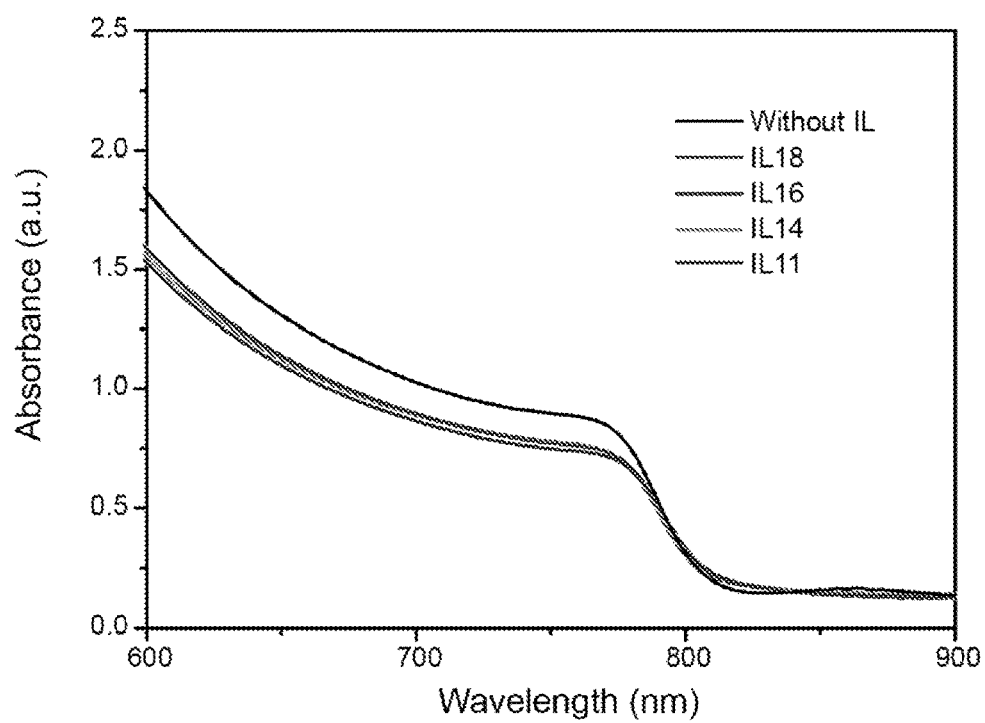
Figure 14:
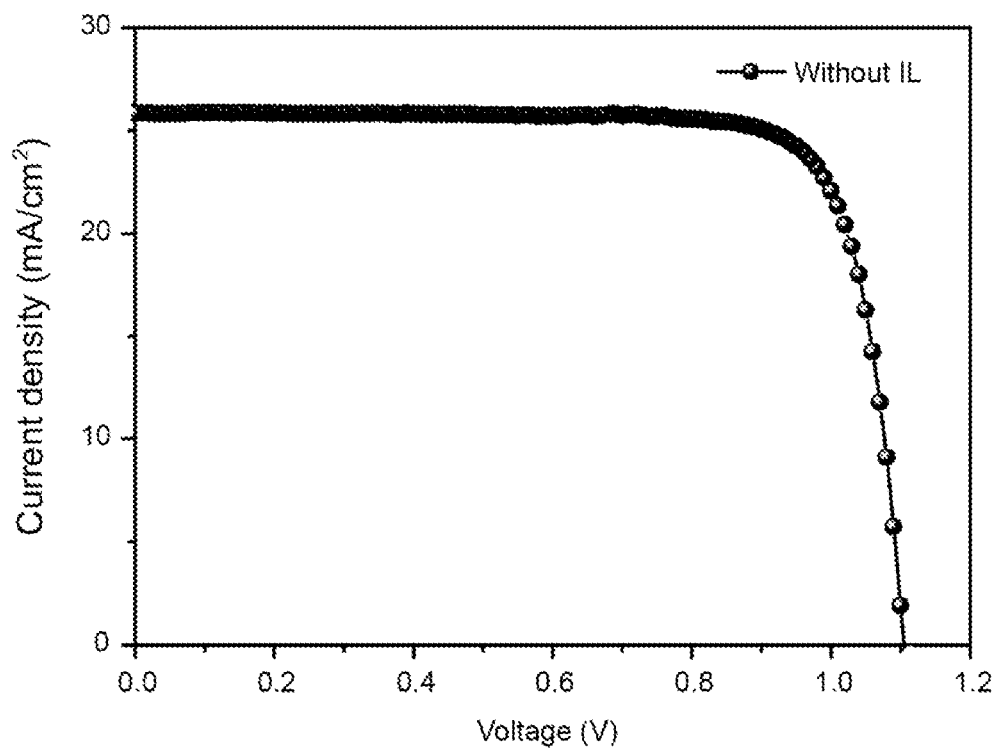
FIG. 14 illustrates a current density-voltage (J-V) scan of a perovskite material photovoltaic device according to some embodiments of the present disclosure.

The device of FIG. 14 was formed without an ionic liquid for comparison purposes. For the remaining devices, an ionic liquid of the present disclosure was added to the lead halide precursor solution in an amount of 0.5 mol %. Ionic liquids including Formula 8 as the cation were used in forming the perovskite material for the devices of FIGS. 3, 5, and 6, with anions of chloride, TFSI, and tetraphenylborate, respectively. Ionic liquids including Formula 9 as the cation were used in forming the perovskite material for the devices of FIGS. 4 and 7, with anions of TFSI and chloride, respectively. Next, 25 μL of each lead halide precursor solution was spin-coated onto the FTO/compact layer $TiO_2$/mesoporous layer $TiO_2$/$SnO_2$ substrate using a two-step program running at 1,000 rpm and 4,000 rpm for 12 seconds and 25 seconds, respectively. During the second step, 750 μL of chlorobenzene was dispensed onto the substrates. Next, the spin-coated films were annealed at 100° C. for 30 minutes and allowed to cool to room temperature. Next, a solution of PEAI diluted in IPA (10 mg/1 mL) was spun on the substrate at 4,000 rpm for 15 seconds. After the PEAI layer was deposited, 45 μL of a spiro-OMeTAD solution was deposited onto the perovskite layer by spin-coating at 4,000 rpm for 12 seconds. The spiro-OMeTAD solution was prepared by dissolving in chlorobenzene with 4-tert-butylpyridine ("TBP"), Li-TFSI in acetonitrile, and Co[t-BuPyPz]$_3$[TFSI]$_3$ ("FK209") in acetonitrile at a molar ratio of spiro-OMeTAD:FK209:Li-TFSI:TBP of 1:0.03:0.5:3.3.2. Finally, 70 nm of gold contact layer was thermally evaporated as a counter electrode to complete the device fabrication.

Solar cell measurements were then carried out at room temperature to generate the current-voltage characteristics and other data for the perovskite solar cells as shown in Figures 46-51 and 57. The active areas of solar cells were masked with a metal aperture of 0.09 cm² to reduce the influence of scattered light. The circuit voltage (Voc), short-circuit current density (Jsc), Fill Factor (FF) and power conversion efficiency (PCE) for each ionic liquid perovskite solar cells and the control perovskite solar cell are listed below in Table 6.

TABLE 6

| Sample Number | Ionic Liquid Cation | Ionic Liquid Anion | Voc (V) | Jsc (mA/cm²) | FF | PCE |
| --- | --- | --- | --- | --- | --- | --- |
| IL11 | Formula 12 | Chloride | 1.12 | 26.20 | 0.813 | 24.01% |
| IL14 | Formula 8 | TFSI | 1.12 | 25.97 | 0.810 | 23.54% |
| IL16 | Formula 12 | TFSI | 1.12 | 25.99 | 0.811 | 23.75% |
| IL18 | Formula 12 | BPh$_4$ | 1.12 | 26.23 | 0.820 | 24.21% |
| IL19 | Formula 8 | Chloride | 1.13 | 25.59 | 0.799 | 23.08% |
| Without IL | — | — | 1.10 | 25.86 | 0.806 | 23.07% |

As can be seen in Table 6, the perovskite PV devices show about 1% absolute improvement in device performance, as compared to the control, while creating a more robust perovskite material that is water resistant.

Figure 9:
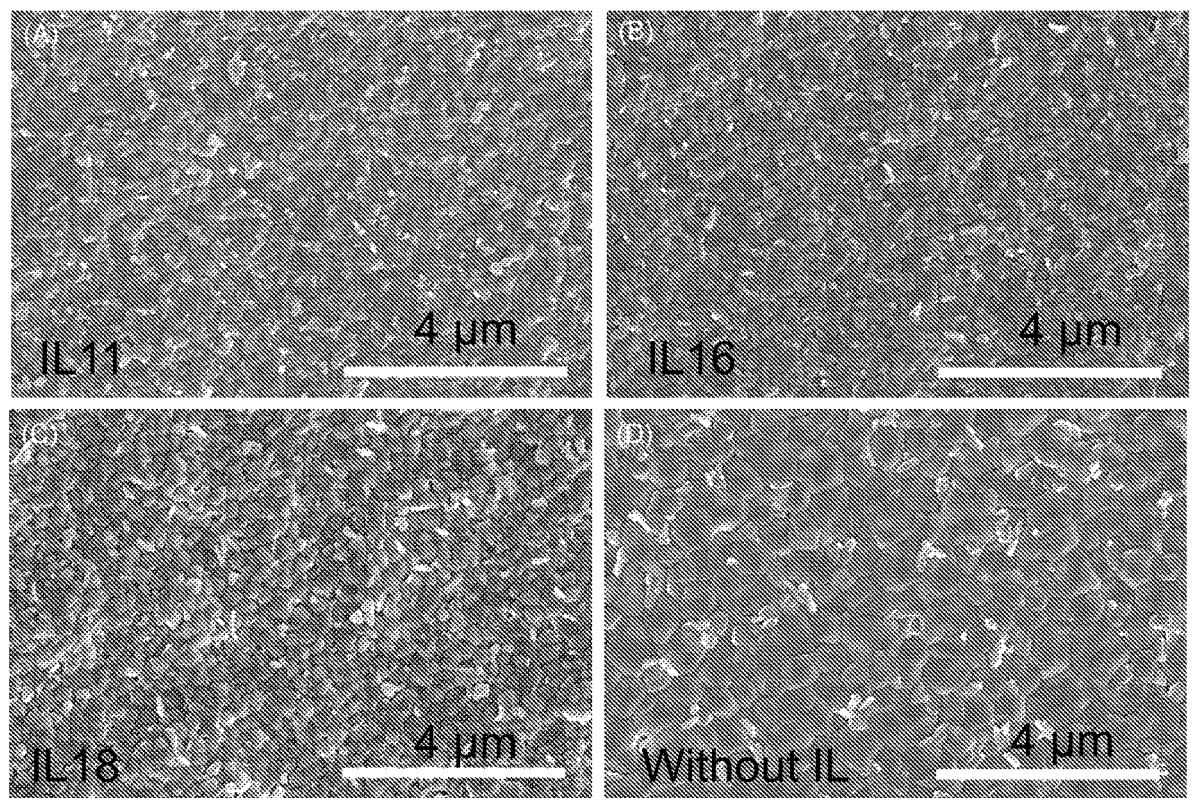
FIG. 9 shows images from a scanning electron microscope comparing a perovskite devices fabricated with ionic liquids and without ionic liquids according to some embodiments of the present disclosure.
Figure 10:
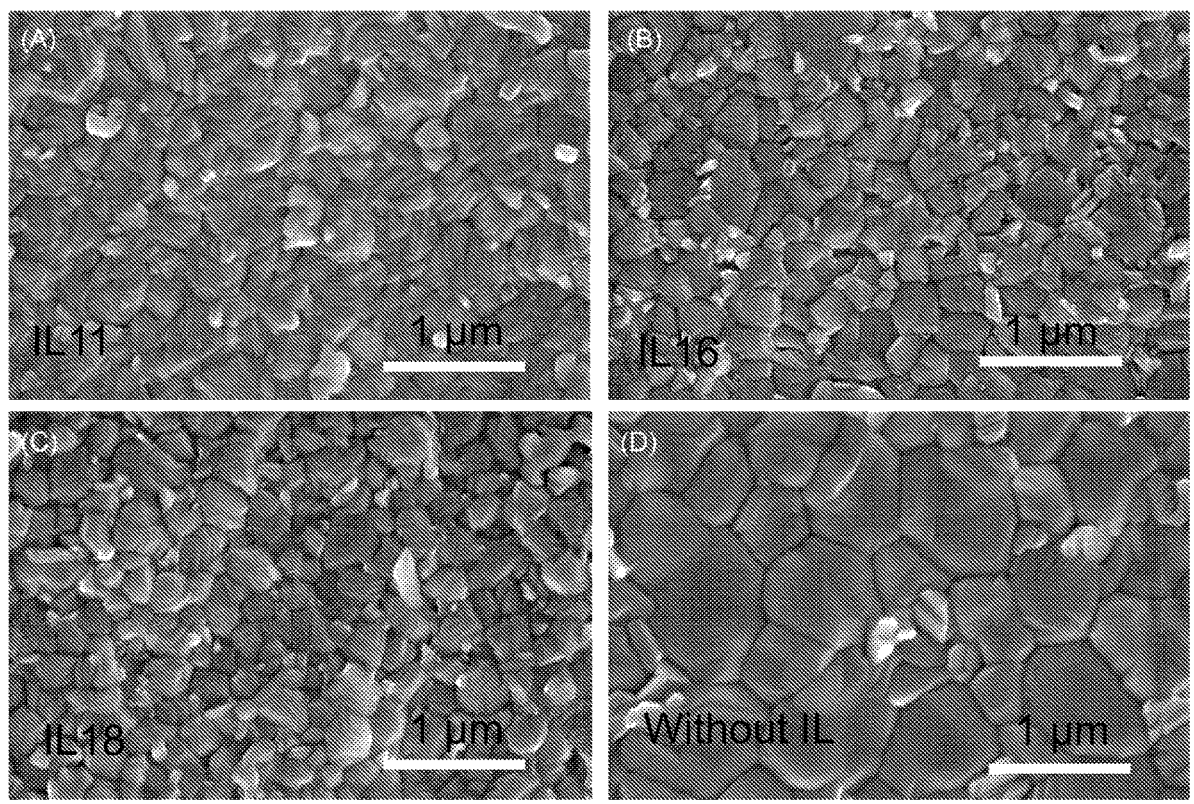
FIG. 10 shows images from a scanning electron microscope comparing a perovskite devices fabricated with ionic liquids and without ionic liquids according to some embodiments of the present disclosure.
Figure 11:
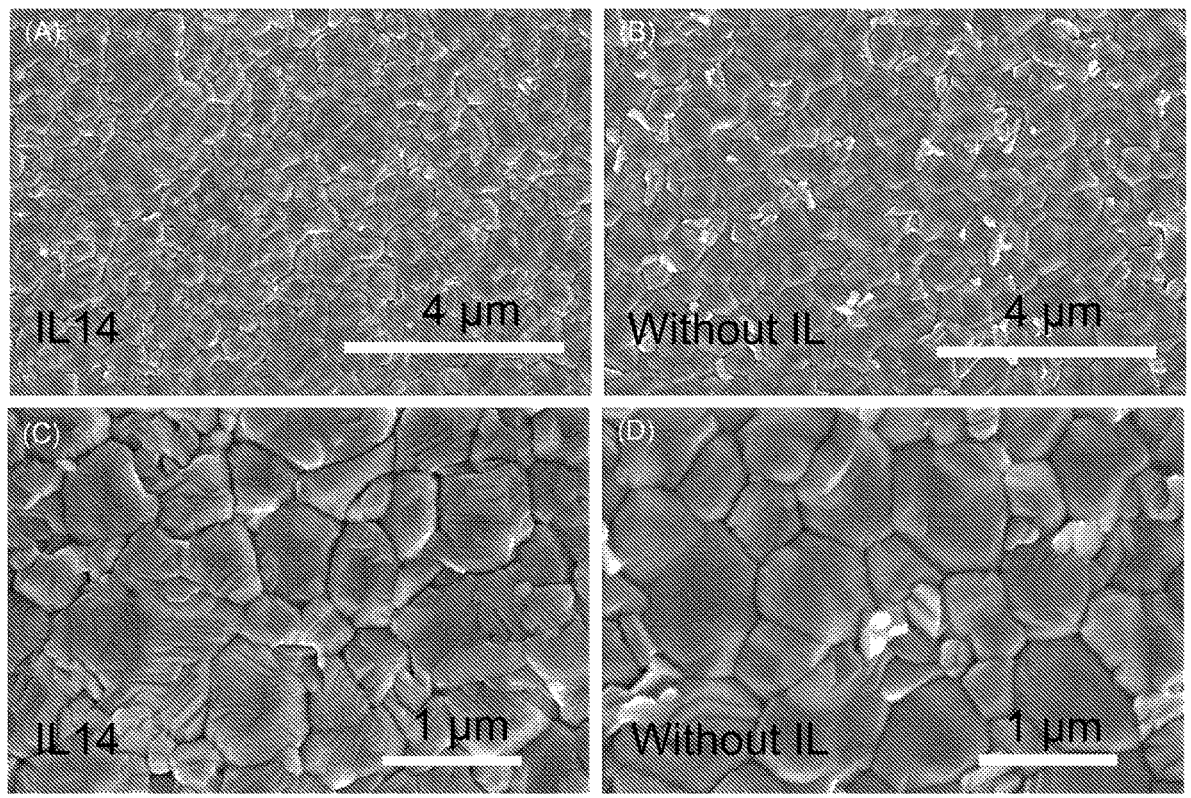
FIG. 11 shows images from a scanning electron microscope comparing a perovskite devices fabricated with ionic liquids and without ionic liquids according to some embodiments of the present disclosure.

FIGS. 9-11 show images from a scanning electron microscope comparing a perovskite PVs fabricated with various ionic liquids to perovskite PVs fabricated without ionic liquids.

Numerous modifications, alterations, and changes to the described embodiments are possible without departing from the scope of the present invention defined in the claims. It is intended that the present invention not be limited to the described embodiments, but that it has the full scope defined by the language of the following claims, and equivalents thereof.

What is claimed is:
1. A method comprising:
forming a perovskite precursor ink comprising a lead halide, an ionic liquid, a solvent, and a formamidinium halide;
depositing the perovskite precursor ink onto a substrate;
drying the perovskite precursor ink to form a perovskite precursor film; and
annealing the perovskite precursor film,
wherein the ionic liquid comprises at least one cation selected from the following formulae:

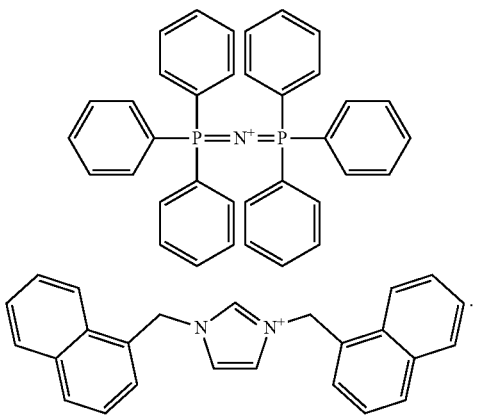

2. The method of claim 1, wherein the perovskite precursor film is a thin film.

3. The method of claim 1, wherein the ionic liquid comprises an anion selected from the group consisting of: a halide, bis(trifluoromethane)sulfonimide (TFSI), and a borate anion of the general formula $[BR_1R_2R_3R_4]^-$, wherein each of $R_1$-$R_4$ are selected from the group consisting of: F,

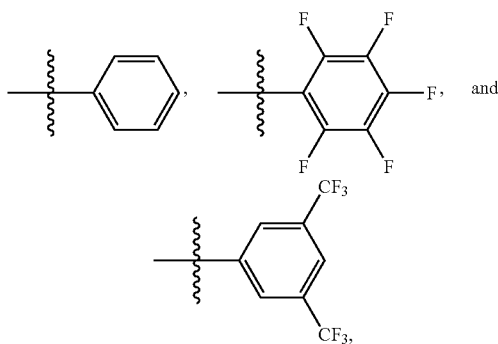

a derivative of the foregoing, and any combination thereof.

4. The method of claim 1, wherein the lead halide comprises lead (II) iodide.

5. The method of claim 1, wherein the perovskite precursor ink is deposited onto the substrate through spin-coating.

6. The method of claim 1, wherein the perovskite precursor film is annealed at 100° C. for 30 minutes.

7. The method of claim 1, wherein the perovskite precursor ink comprises the ionic liquid in an amount from about 0.01 to about 10 mol % with respect to the lead atoms in the perovskite precursor ink.

8. A perovskite material prepared by a process comprising the steps of:
forming a perovskite precursor ink comprising a lead halide, an ionic liquid, a solvent, and a formamidinium halide;
depositing the perovskite precursor ink onto a substrate;
drying the perovskite precursor ink to form a perovskite precursor film; and
annealing the perovskite film to form the perovskite material,
wherein the ionic liquid comprises at least one cation selected from the following formulae:

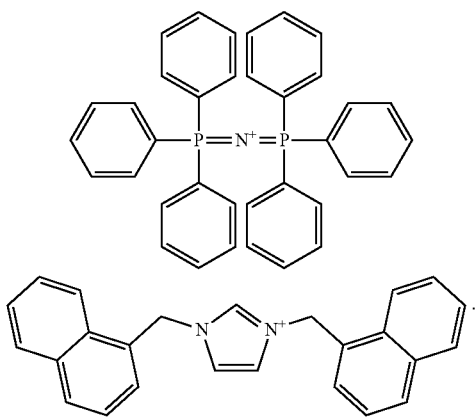

9. The perovskite material of claim 8, wherein the perovskite precursor film is a thin film.

10. The perovskite material of claim 8, wherein the ionic liquid comprises an organic cation.

11. The perovskite material of claim 8, wherein the ionic liquid comprises an anion selected from the group consisting of: a halide, bis(trifluoromethane)sulfonimide (TFSI), and a borate anion of the general formula $[BR_1R_2R_3R_4]^-$, wherein each of $R_1$-$R_4$ are selected from the group consisting of: F,

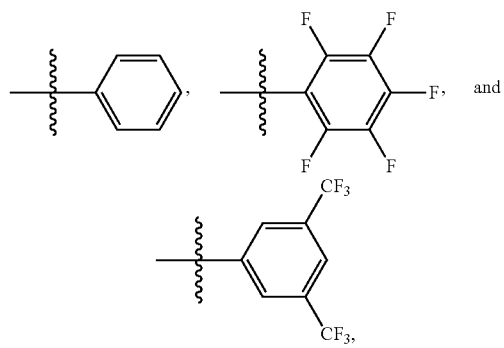

a derivative of the foregoing, and any combination thereof.

12. The perovskite material of claim 8, wherein the lead halide comprises lead (II) iodide.

13. The perovskite material of claim 8, wherein the perovskite precursor ink is deposited onto the substrate through spin-coating.

14. The perovskite material of claim 8, wherein the perovskite precursor film is annealed at 100° C. for 30 minutes.

15. The perovskite material of claim 8, wherein the perovskite precursor ink comprises the ionic liquid in an amount from about 0.01 to about 10 mol % with respect to the lead atoms in the perovskite precursor ink.

16. A method comprising:
forming a lead halide precursor ink comprising a group 1 metal halide, a lead halide, an ionic liquid, and a solvent;
depositing the lead halide precursor ink onto a substrate;
drying the lead halide precursor ink to form a lead halide film; and
annealing the lead halide film,
wherein the ionic liquid comprises at least one cation selected from the following formulae:

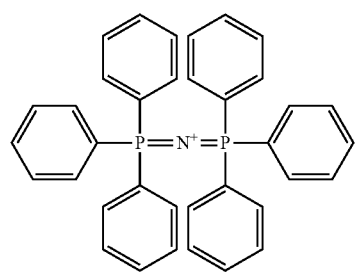

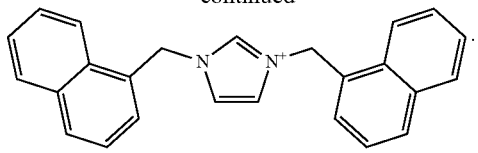

17. The method of claim 16, wherein the ionic liquid further comprises a cation selected from the group consisting of: ammonium, formamidinium, guanidinium, an ethene tetramine cation, an imidazolium cation, a compound of the general formula $[R_3R_2R_1PNPR_4R_5R_6]+$, a cation having the general formula of $[R_3R_2R_1PNPR_4R_5R_6]+$, and any combination thereof,
    wherein each of $R_1$-$R_6$ are independently selected from the group consisting of: hydrogen; a methyl group; an ethyl group; a propyl group; a butyl group; a pentyl group; an alkane; an alkene; an alkyne, an alkyl halide; an aromatic group; a cyclic complex where at least one nitrogen is contained within a ring; a sulfur-containing group; a nitrogen-containing group; a phosphorous containing group; a boron-containing group; an organic acid and ester or amide derivatives thereof, an amino acid; a silicon-containing group; an alkoxy group; a halide; a pseudohalide, and any combination thereof.

18. The method of claim 16, wherein the ionic liquid comprises the cation of the formula:

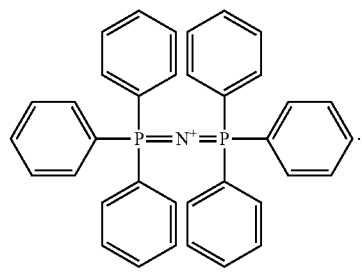 [SMILES: c1ccc(P(=[N+]=P(c2ccccc2)(c2ccccc2)c2ccccc2)(c2ccccc2)c2ccccc2)cc1]

19. The method of claim 16, wherein the ionic liquid comprises the cation of the formula:

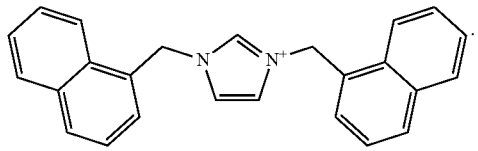 [SMILES: c1ccc2c(Cn3cc[n+](Cc4cccc5ccccc45)c3)cccc2c1]

* * * * *